United States Patent
Yamagiwa et al.

(10) Patent No.: US 9,948,319 B2
(45) Date of Patent: Apr. 17, 2018

(54) DATA COMPRESSION/DECOMPRESSION SYSTEM, DATA COMPRESSION METHOD AND DATA DECOMPRESSION METHOD, AND DATA COMPRESSOR AND DATA DECOMPRESSOR

(71) Applicant: UNIVERSITY OF TSUKUBA, Ibaraki (JP)

(72) Inventors: Shinichi Yamagiwa, Ibaraki (JP); Hiroshi Sakamoto, Fukuoka (JP)

(73) Assignee: UNIVERSITY OF TSUKUBA, Ibaraki (JP)

( * ) Notice: Subject to any disclaimer, the term of this patent is extended or adjusted under 35 U.S.C. 154(b) by 0 days.

(21) Appl. No.: 15/560,577

(22) PCT Filed: Mar. 24, 2016

(86) PCT No.: PCT/JP2016/059372
§ 371 (c)(1),
(2) Date: Sep. 22, 2017

(87) PCT Pub. No.: WO2016/152972
PCT Pub. Date: Sep. 29, 2016

(65) Prior Publication Data
US 2018/0054215 A1    Feb. 22, 2018

(30) Foreign Application Priority Data
Mar. 25, 2015   (JP) ................. 2015-063449

(51) Int. Cl.
*H03M 7/40* (2006.01)
*H03M 7/42* (2006.01)
*H03M 7/46* (2006.01)
*H03M 7/30* (2006.01)

(52) U.S. Cl.
CPC ........... *H03M 7/42* (2013.01); *H03M 7/3084* (2013.01); *H03M 7/46* (2013.01)

(58) Field of Classification Search
CPC ......... H03M 7/42; H03M 7/46; H03M 7/3084
(Continued)

(56) References Cited

U.S. PATENT DOCUMENTS 5,600,315 A * 2/1997 Shimpuku .......... G11B 20/1426
   341/59
8,532,220 B2 * 9/2013 Lu .......................... H03M 7/30
   375/246

(Continued)

FOREIGN PATENT DOCUMENTS

JP   3-247168   11/1991
JP   5-176001    7/1993
(Continued)

OTHER PUBLICATIONS

Search Report in International Application No. PCT/JP2016/059372 dated Jun. 14, 2016, 4 pages.
Notification of Reasons of Refusal in JP Application No. 2015-063449 dated Aug. 29, 2017, 8 pages.
International Preliminary Report on Patentability in International Application No. PCT/JP2016/059372 dated Nov. 16, 2017, 8 pages.

*Primary Examiner* — Lam T Mai
(74) *Attorney, Agent, or Firm* — Marshall, Gerstein & Borun LLP

(57) ABSTRACT

In a data compression method, a data string is compressed in units of symbols, each of the symbols being data having a fixed length. Then, a conversion table in which an entry indicating a correspondence between two or more pre-conversion symbols and one post-conversion symbol is registered is searched, and if it is determined that two or more consecutive symbols in the data string are not registered as two or more pre-conversion symbols, an entry in which the two or more consecutive symbols are registered as two or more pre-conversion symbols is registered in the conversion table, and the two or more consecutive symbols
(Continued)

are output without conversion, and if two or more consecutive symbols in the data string are registered as two or more pre-conversion symbols in an entry in the conversion table, the two or more consecutive symbols are converted into one post-conversion symbol, the one post-conversion symbol being in correspondence with the two or more consecutive symbols in the entry.

8 Claims, 46 Drawing Sheets

(58) Field of Classification Search
USPC .................................................. 341/65–70
See application file for complete search history.

(56) References Cited

U.S. PATENT DOCUMENTS

| | | | |
|---|---|---|---|
| 9,547,588 B1* | 1/2017 | Biederman | ......... G06F 12/0246 |
| 2004/0264698 A1 | 12/2004 | Oda | |
| 2011/0206145 A1 | 8/2011 | Lu et al. | |
| 2011/0273976 A1* | 11/2011 | Higashino | .......... G11B 20/1426 |
| | | | 369/59.24 |

FOREIGN PATENT DOCUMENTS

| JP | 7-7436 | 1/1995 |
|---|---|---|
| JP | 2005-20346 | 1/2005 |
| JP | 2013-520926 A | 6/2013 |
| JP | 2014-236449 A | 12/2014 |

* cited by examiner

FIG.3

| SYMBOL STRING TO BE COMPRESSED | | COMPRESSED SYMBOL | REFERENCE FREQUENCY |
|---|---|---|---|
| SYMBOL 0 | SYMBOL 1 | | |
| A | A | 0 | 1 |
| B | B | 1 | 1 |
| C | C | 2 | 2 |
| D | D | 3 | 1 |
| ⋮ | ⋮ | ⋮ | ⋮ |

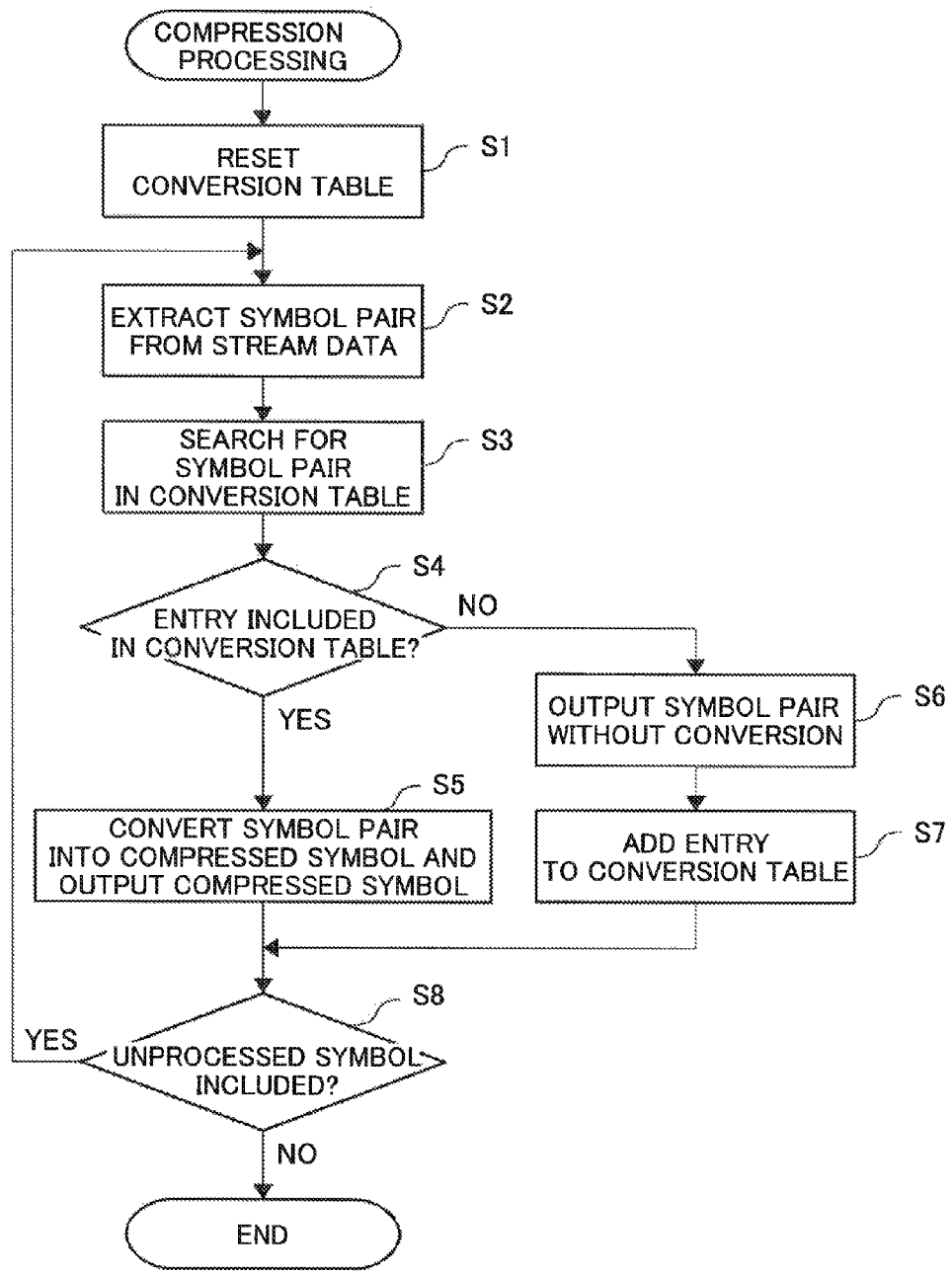

FIG.5A

INPUT DATA: AABBCCDDCCBBCCAA

| SYMBOL STRING TO BE COMPRESSED | | COMPRESSED SYMBOL | REFERENCE FREQUENCY |
|---|---|---|---|
| SYMBOL 0 | SYMBOL 1 | | |
| | | | |
| | | | |
| | | | |
| | | | |

OUTPUT DATA:

FIG.5B

INPUT DATA: AABBCCDDCCBBCCAA

| SYMBOL STRING TO BE COMPRESSED | | COMPRESSED SYMBOL | REFERENCE FREQUENCY |
|---|---|---|---|
| SYMBOL 0 | SYMBOL 1 | | |
| A | A | 0 | 1 |
| | | | |
| | | | |
| | | | |

OUTPUT DATA: AA

FIG.5C

INPUT DATA: AABBCCDDCCBBCCAA

| SYMBOL STRING TO BE COMPRESSED | | COMPRESSED SYMBOL | REFERENCE FREQUENCY |
|---|---|---|---|
| SYMBOL 0 | SYMBOL 1 | | |
| A | A | 0 | 1 |
| B | B | 1 | 1 |
| | | | |
| | | | |

OUTPUT DATA: AABB

FIG.5D

INPUT DATA: AABBCCDDCCBBCCAA

| SYMBOL STRING TO BE COMPRESSED | | COMPRESSED SYMBOL | REFERENCE FREQUENCY |
|---|---|---|---|
| SYMBOL 0 | SYMBOL 1 | | |
| A | A | 0 | 1 |
| B | B | 1 | 1 |
| C | C | 2 | 1 |
| | | | |

OUTPUT DATA: AABBCC

FIG.5E

INPUT DATA: AABBCCDDCCBBCCAA

| SYMBOL STRING TO BE COMPRESSED | | COMPRESSED SYMBOL | REFERENCE FREQUENCY |
|---|---|---|---|
| SYMBOL 0 | SYMBOL 1 | | |
| A | A | 0 | 1 |
| B | B | 1 | 1 |
| C | C | 2 | 1 |
| D | D | 3 | 1 |

OUTPUT DATA: AABBCCDD

FIG.5F

INPUT DATA: AABBCCDDCCBBCCAA

| SYMBOL STRING TO BE COMPRESSED | | COMPRESSED SYMBOL | REFERENCE FREQUENCY |
|---|---|---|---|
| SYMBOL 0 | SYMBOL 1 | | |
| A | A | 0 | 1 |
| B | B | 1 | 1 |
| C | C | 2 | 2 |
| D | D | 3 | 1 |

OUTPUT DATA: AABBCCDD2

FIG.5G

INPUT DATA: AABBCCDDCCBBCCAA

| SYMBOL STRING TO BE COMPRESSED | | COMPRESSED SYMBOL | REFERENCE FREQUENCY |
|---|---|---|---|
| SYMBOL 0 | SYMBOL 1 | | |
| A | A | 0 | 1 |
| B | B | 1 | *2* |
| C | C | 2 | 2 |
| D | D | 3 | 1 |

OUTPUT DATA: AABBCCDD21

FIG.5H

INPUT DATA: AABBCCDDCCBBCCAA

| SYMBOL STRING TO BE COMPRESSED | | COMPRESSED SYMBOL | REFERENCE FREQUENCY |
|---|---|---|---|
| SYMBOL 0 | SYMBOL 1 | | |
| A | A | 0 | 1 |
| B | B | 1 | 2 |
| C | C | 2 | *3* |
| D | D | 3 | 1 |

OUTPUT DATA: AABBCCDD212

FIG.5I

INPUT DATA: AABBCCDDCCBBCCAA

| SYMBOL STRING TO BE COMPRESSED | | COMPRESSED SYMBOL | REFERENCE FREQUENCY |
|---|---|---|---|
| SYMBOL 0 | SYMBOL 1 | | |
| A | A | 0 | *2* |
| B | B | 1 | 2 |
| C | C | 2 | 3 |
| D | D | 3 | 1 |

OUTPUT DATA: AABBCCDD2120

FIG.7

| DECODED SYMBOL STRING || COMPRESSED SYMBOL | REFERENCE FREQUENCY |
|---|---|---|---|
| SYMBOL 0 | SYMBOL 1 | | |
| A | A | 0 | 1 |
| B | B | 1 | 1 |
| C | C | 2 | 2 |
| D | D | 3 | 1 |
| ⋮ | ⋮ | ⋮ | ⋮ |

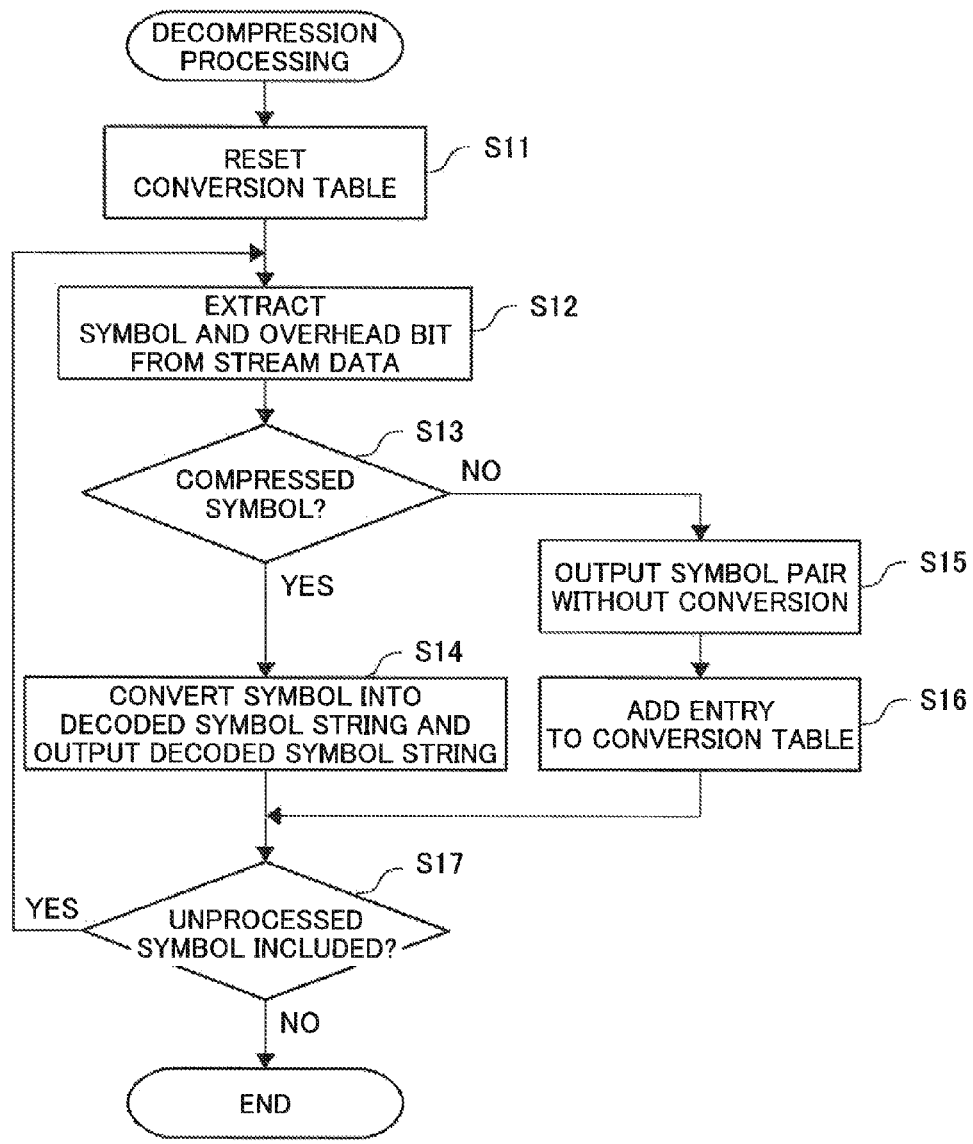

FIG.9A

| INPUT DATA: AABBCCDD2120 |||||
|---|---|---|---|

| DECODED SYMBOL STRING || COMPRESSED SYMBOL | REFERENCE FREQUENCY |
|---|---|---|---|
| SYMBOL 0 | SYMBOL 1 | | |
|  |  |  |  |
|  |  |  |  |
|  |  |  |  |
|  |  |  |  |

OUTPUT DATA:

FIG.9B

| INPUT DATA: AABBCCDD2120 ||||

| DECODED SYMBOL STRING || COMPRESSED SYMBOL | REFERENCE FREQUENCY |
|---|---|---|---|
| SYMBOL 0 | SYMBOL 1 | | |
| A | A | 0 | 1 |
|  |  |  |  |
|  |  |  |  |
|  |  |  |  |

OUTPUT DATA: AA

FIG.9C

| INPUT DATA: AABBCCDD2120 ||||

| DECODED SYMBOL STRING || COMPRESSED SYMBOL | REFERENCE FREQUENCY |
|---|---|---|---|
| SYMBOL 0 | SYMBOL 1 | | |
| A | A | 0 | 1 |
| B | B | 1 | 1 |
|  |  |  |  |
|  |  |  |  |

OUTPUT DATA: AABB

FIG.9D

INPUT DATA: AABBCCDD2120

| DECODED SYMBOL STRING | | COMPRESSED SYMBOL | REFERENCE FREQUENCY |
|---|---|---|---|
| SYMBOL 0 | SYMBOL 1 | | |
| A | A | 0 | 1 |
| B | B | 1 | 1 |
| C | C | 2 | 1 |
| | | | |

OUTPUT DATA: AABBCC

FIG.9E

INPUT DATA: AABBCCDD2120

| DECODED SYMBOL STRING | | COMPRESSED SYMBOL | REFERENCE FREQUENCY |
|---|---|---|---|
| SYMBOL 0 | SYMBOL 1 | | |
| A | A | 0 | 1 |
| B | B | 1 | 1 |
| C | C | 2 | 1 |
| D | D | 3 | 1 |

OUTPUT DATA: AABBCCDD

FIG.9F

INPUT DATA: AABBCCDD2120

| DECODED SYMBOL STRING | | COMPRESSED SYMBOL | REFERENCE FREQUENCY |
|---|---|---|---|
| SYMBOL 0 | SYMBOL 1 | | |
| A | A | 0 | 1 |
| B | B | 1 | 1 |
| C | C | 2 | 2 |
| D | D | 3 | 1 |

OUTPUT DATA: AABBCCDDCC

FIG.9G

| INPUT DATA: AABBCCDD2120 |

| DECODED SYMBOL STRING || COMPRESSED SYMBOL | REFERENCE FREQUENCY |
|---|---|---|---|
| SYMBOL 0 | SYMBOL 1 | | |
| A | A | 0 | 1 |
| B | B | 1 | <u>2</u> |
| C | C | 2 | 2 |
| D | D | 3 | 1 |

| OUTPUT DATA: AABBCCDDCCBB |

FIG.9H

| INPUT DATA: AABBCCDD2120 |

| DECODED SYMBOL STRING || COMPRESSED SYMBOL | REFERENCE FREQUENCY |
|---|---|---|---|
| SYMBOL 0 | SYMBOL 1 | | |
| A | A | 0 | 1 |
| B | B | 1 | 2 |
| C | C | 2 | <u>3</u> |
| D | D | 3 | 1 |

| OUTPUT DATA: AABBCCDDCCBBCC |

FIG.9I

| INPUT DATA: AABBCCDD2120 |

| DECODED SYMBOL STRING || COMPRESSED SYMBOL | REFERENCE FREQUENCY |
|---|---|---|---|
| SYMBOL 0 | SYMBOL 1 | | |
| A | A | 0 | <u>2</u> |
| B | B | 1 | 2 |
| C | C | 2 | 3 |
| D | D | 3 | 1 |

| OUTPUT DATA: AABBCCDDCCBBCCAA |

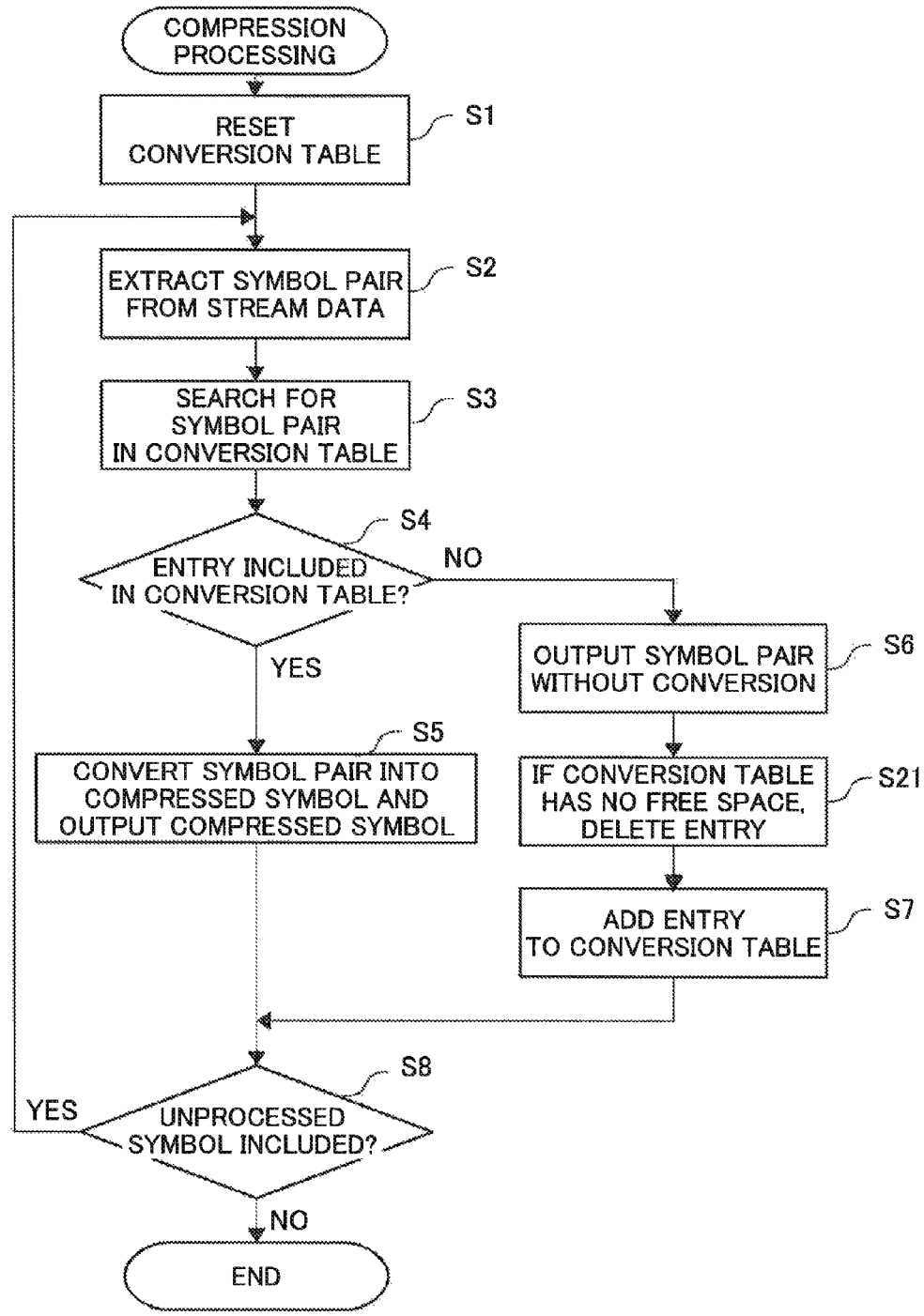

FIG.11A

| INPUT DATA: AABBCCDDCCBBCCAADDDDDEE |||||
|---|---|---|---|

| SYMBOL STRING TO BE COMPRESSED || COMPRESSED SYMBOL | REFERENCE FREQUENCY |
|---|---|---|---|
| SYMBOL 0 | SYMBOL 1 | | |
| A | A | 0 | 2 |
| B | B | 1 | 2 |
| C | C | 2 | 3 |
| D | D | 3 | 4 |

| OUTPUT DATA: AABBCCDD210333EE |
|---|

FIG.11B

| INPUT DATA: AABBCCDDCCBBCCAADDDDDEE |||||
|---|---|---|---|

| SYMBOL STRING TO BE COMPRESSED || COMPRESSED SYMBOL | REFERENCE FREQUENCY |
|---|---|---|---|
| SYMBOL 0 | SYMBOL 1 | | |
| A | A | 0 | <u>1</u> |
| B | B | 1 | <u>1</u> |
| C | C | 2 | <u>2</u> |
| D | D | 3 | <u>3</u> |

| OUTPUT DATA: AABBCCDD210333EE |
|---|

FIG.11C

| INPUT DATA: AABBCCDDCCBBCCAADDDDDEE |||||
|---|---|---|---|

| SYMBOL STRING TO BE COMPRESSED || COMPRESSED SYMBOL | REFERENCE FREQUENCY |
|---|---|---|---|
| SYMBOL 0 | SYMBOL 1 | | |
|  |  |  |  |
|  |  |  |  |
| C | C | 2 | 2 |
| D | D | 3 | 3 |

| OUTPUT DATA: AABBCCDD210333EE |
|---|

FIG.11D

| INPUT DATA: AABBCCDDCCBBCCAADDDDDEE |||| 
|---|---|---|---|
| SYMBOL STRING TO BE COMPRESSED || COMPRESSED SYMBOL | REFERENCE FREQUENCY |
| SYMBOL 0 | SYMBOL 1 | | |
| E | E | 0 | 1 |
|   |   |   |   |
| C | C | 2 | 2 |
| D | D | 3 | 3 |

OUTPUT DATA: AABBCCDD210333EE

FIG.13A

INPUT DATA: AABBCCDD210333EE

| DECODED SYMBOL STRING | | COMPRESSED SYMBOL | REFERENCE FREQUENCY |
|---|---|---|---|
| SYMBOL 0 | SYMBOL 1 | | |
| A | A | 0 | 2 |
| B | B | 1 | 2 |
| C | C | 2 | 3 |
| D | D | 3 | 4 |

OUTPUT DATA: AABBCCDDCCBBCCAADDDDDDEE

FIG.13B

INPUT DATA: AABBCCDD210333EE

| DECODED SYMBOL STRING | | COMPRESSED SYMBOL | REFERENCE FREQUENCY |
|---|---|---|---|
| SYMBOL 0 | SYMBOL 1 | | |
| A | A | 0 | 1 |
| B | B | 1 | 1 |
| C | C | 2 | 2 |
| D | D | 3 | 3 |

OUTPUT DATA: AABBCCDDCCBBCCAADDDDDDEE

FIG.13C

INPUT DATA: AABBCCDD210333EE

| DECODED SYMBOL STRING | | COMPRESSED SYMBOL | REFERENCE FREQUENCY |
|---|---|---|---|
| SYMBOL 0 | SYMBOL 1 | | |
|  |  |  |  |
|  |  |  |  |
| C | C | 2 | 2 |
| D | D | 3 | 3 |

OUTPUT DATA: AABBCCDDCCBBCCAADDDDDDEE

FIG.13D

| INPUT DATA: AABBCCDD210333EE |||| 
|---|---|---|---|
| DECODED SYMBOL STRING || COMPRESSED SYMBOL | REFERENCE FREQUENCY |
| SYMBOL 0 | SYMBOL 1 | | |
| E | E | 0 | 1 |
|  |  |  |  |
| C | C | 2 | 2 |
| D | D | 3 | 3 |

| OUTPUT DATA: AABBCCDDCCBBCCAADDDDDEE |
|---|

FIG.15A

| INPUT DATA: AABBCCDDCCBBCCAAEE |||||
|---|---|---|---|---|
| SYMBOL STRING TO BE COMPRESSED || COMPRESSED SYMBOL | REFERENCE FREQUENCY ||
| SYMBOL 0 | SYMBOL 1 | | ||
| A | A | 0 | 2 ||
| B | B | 1 | 2 ||
| C | C | 2 | 3 ||
| D | D | 3 | 1 ||

| STACK ||||
|---|---|---|---|
| SYMBOL 0 | SYMBOL 1 | COMPRESSED SYMBOL | REFERENCE FREQUENCY |
| A | A | 0 | 2 |
| C | C | 2 | 3 |

OUTPUT DATA: AABBCCDD210EE

FIG.15B

| INPUT DATA: AABBCCDDCCBBCCAAEE |||||
|---|---|---|---|---|
| SYMBOL STRING TO BE COMPRESSED || COMPRESSED SYMBOL | REFERENCE FREQUENCY ||
| SYMBOL 0 | SYMBOL 1 | | ||
| A | A | 0 | <u>1</u> ||
| B | B | 1 | 2 ||
| C | C | 2 | <u>2</u> ||
| D | D | 3 | 1 ||

| STACK ||||
|---|---|---|---|
| SYMBOL 0 | SYMBOL 1 | COMPRESSED SYMBOL | REFERENCE FREQUENCY |
|  |  |  |  |
|  |  |  |  |

OUTPUT DATA: AABBCCDD210EE

FIG.15C

INPUT DATA: AABBCCDDCCBBCCAAEE

| SYMBOL STRING TO BE COMPRESSED | | COMPRESSED SYMBOL | REFERENCE FREQUENCY |
|---|---|---|---|
| SYMBOL 0 | SYMBOL 1 | | |
|  |  |  |  |
| B | B | 1 | 2 |
| C | C | 2 | 2 |
| D | D | 3 | 1 |

| STACK | | | |
|---|---|---|---|
| SYMBOL 0 | SYMBOL 1 | COMPRESSED SYMBOL | REFERENCE FREQUENCY |
|  |  |  |  |
|  |  |  |  |

OUTPUT DATA: AABBCCDD210EE

FIG.15D

INPUT DATA: AABBCCDDCCBBCCAAEE

| SYMBOL STRING TO BE COMPRESSED | | COMPRESSED SYMBOL | REFERENCE FREQUENCY |
|---|---|---|---|
| SYMBOL 0 | SYMBOL 1 | | |
| E | E | 0 | 1 |
| B | B | 1 | 2 |
| C | C | 2 | 2 |
| D | D | 3 | 1 |

| STACK | | | |
|---|---|---|---|
| SYMBOL 0 | SYMBOL 1 | COMPRESSED SYMBOL | REFERENCE FREQUENCY |
| E | E | 0 | 1 |
|  |  |  |  |

OUTPUT DATA: AABBCCDD210EE

FIG.17A

INPUT DATA: AABBCCDD210EE

| DECODED SYMBOL STRING || COMPRESSED SYMBOL | REFERENCE FREQUENCY |
| SYMBOL 0 | SYMBOL 1 | | |
|---|---|---|---|
| A | A | 0 | 2 |
| B | B | 1 | 2 |
| C | C | 2 | 3 |
| D | D | 3 | 1 |

| STACK ||||
| SYMBOL 0 | SYMBOL 1 | COMPRESSED SYMBOL | REFERENCE FREQUENCY |
|---|---|---|---|
| A | A | 0 | 2 |
| C | C | 2 | 3 |

OUTPUT DATA: AABBCCDDCCBBCCAAEE

FIG.17B

INPUT DATA: AABBCCDD210EE

| DECODED SYMBOL STRING || COMPRESSED SYMBOL | REFERENCE FREQUENCY |
| SYMBOL 0 | SYMBOL 1 | | |
|---|---|---|---|
| A | A | 0 | <u>1</u> |
| B | B | 1 | 2 |
| C | C | 2 | <u>2</u> |
| D | D | 3 | 1 |

| STACK ||||
| SYMBOL 0 | SYMBOL 1 | COMPRESSED SYMBOL | REFERENCE FREQUENCY |
|---|---|---|---|
|  |  |  |  |
|  |  |  |  |

OUTPUT DATA: AABBCCDDCCBBCCAAEE

FIG.17C

| INPUT DATA: AABBCCDD210EE |||||
|---|---|---|---|---|
| DECODED SYMBOL STRING || COMPRESSED SYMBOL | REFERENCE FREQUENCY ||
| SYMBOL 0 | SYMBOL 1 | | ||
|  |  |  |  ||
| B | B | 1 | 2 ||
| C | C | 2 | 2 ||
| D | D | 3 | 1 ||

| STACK ||||
|---|---|---|---|
| SYMBOL 0 | SYMBOL 1 | COMPRESSED SYMBOL | REFERENCE FREQUENCY |
|  |  |  |  |
|  |  |  |  |

OUTPUT DATA: AABBCCDDCCBBCCAAEE

FIG.17D

| INPUT DATA: AABBCCDD210EE |||||
|---|---|---|---|---|
| DECODED SYMBOL STRING || COMPRESSED SYMBOL | REFERENCE FREQUENCY ||
| SYMBOL 0 | SYMBOL 1 | | ||
| E | E | 0 | 1 ||
|  |  |  |  ||
| C | C | 2 | 2 ||
| D | D | 3 | 3 ||

| STACK ||||
|---|---|---|---|
| SYMBOL 0 | SYMBOL 1 | COMPRESSED SYMBOL | REFERENCE FREQUENCY |
| E | E | 0 | 1 |
|  |  |  |  |

OUTPUT DATA: AABBCCDDCCBBCCAAEE

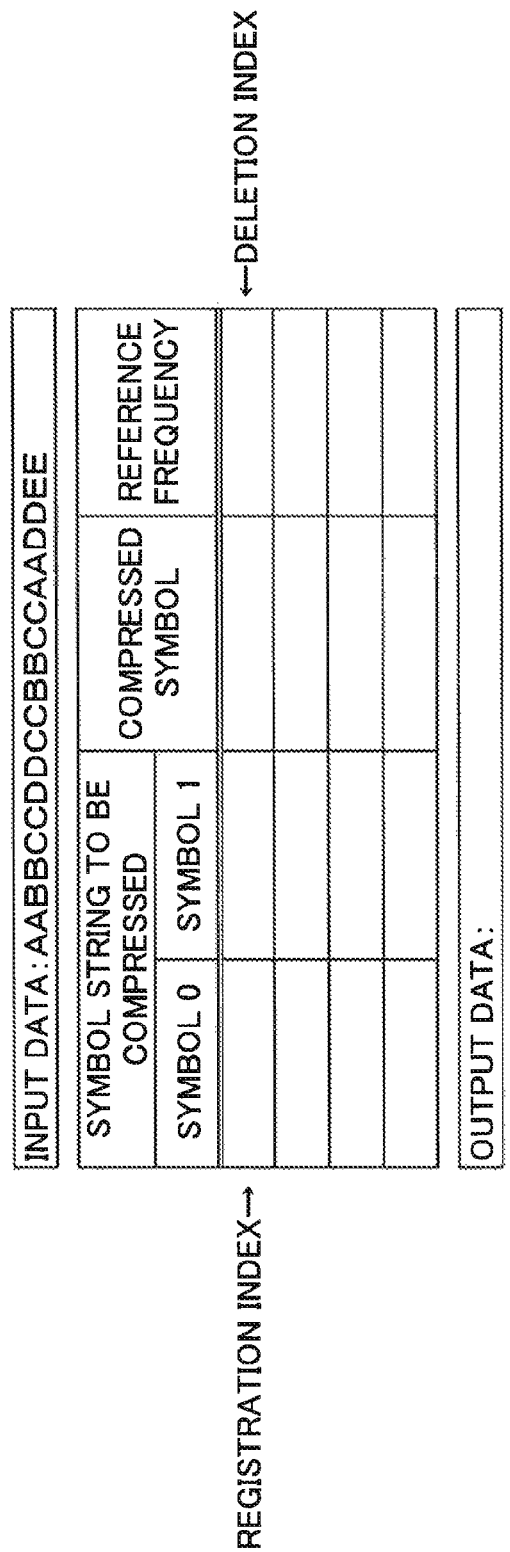

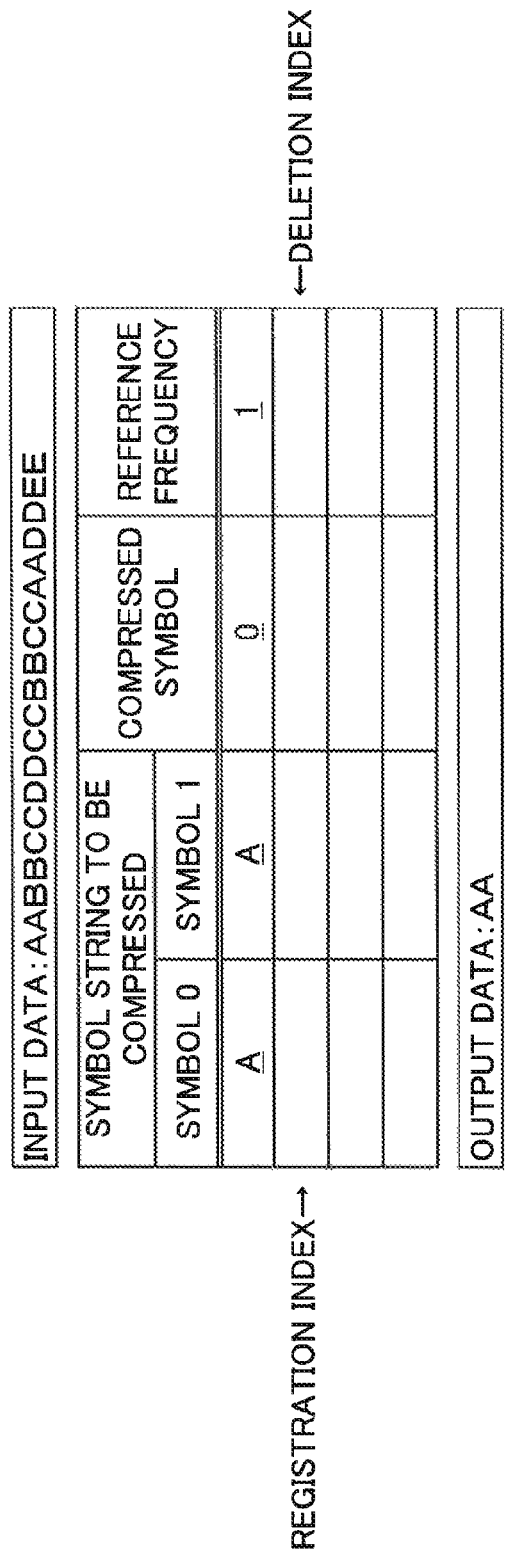

FIG.20C

INPUT DATA: AABBCCDDCCBBCCAADDEE

| SYMBOL STRING TO BE COMPRESSED | | COMPRESSED SYMBOL | REFERENCE FREQUENCY |
|---|---|---|---|
| SYMBOL 0 | SYMBOL 1 | | |
| A | A | 0 | 1 |
| B | B | 1 | 1 |
| | | | |
| | | | |

← DELETION INDEX

OUTPUT DATA: AABB

REGISTRATION INDEX →

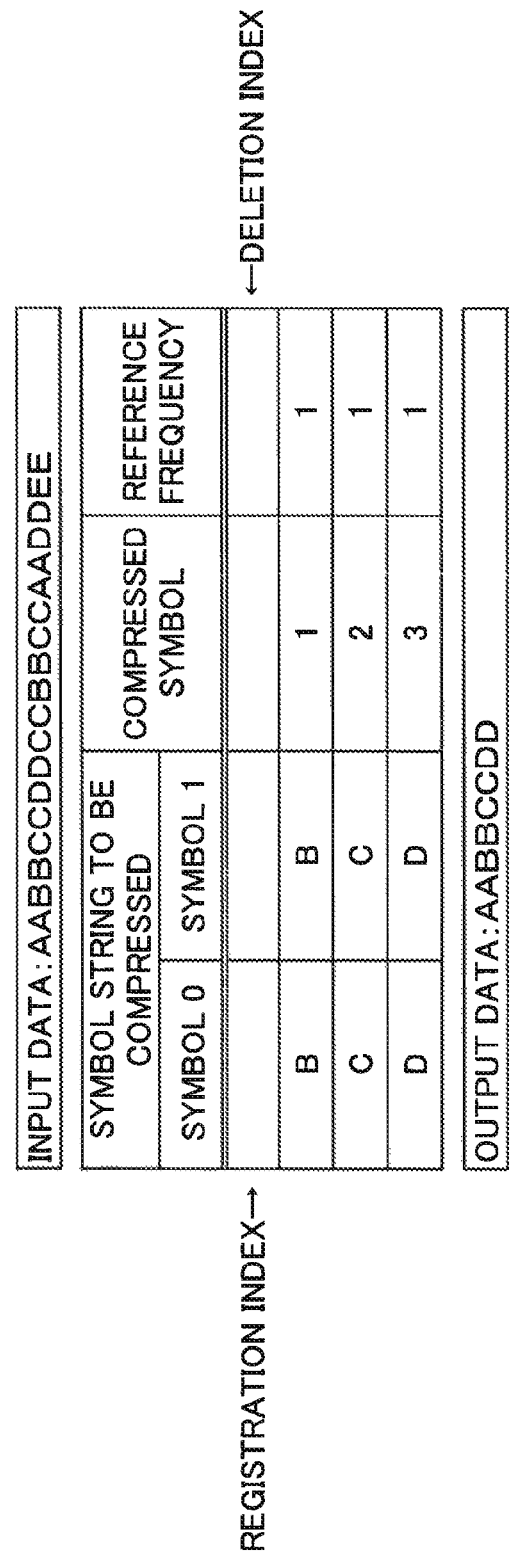

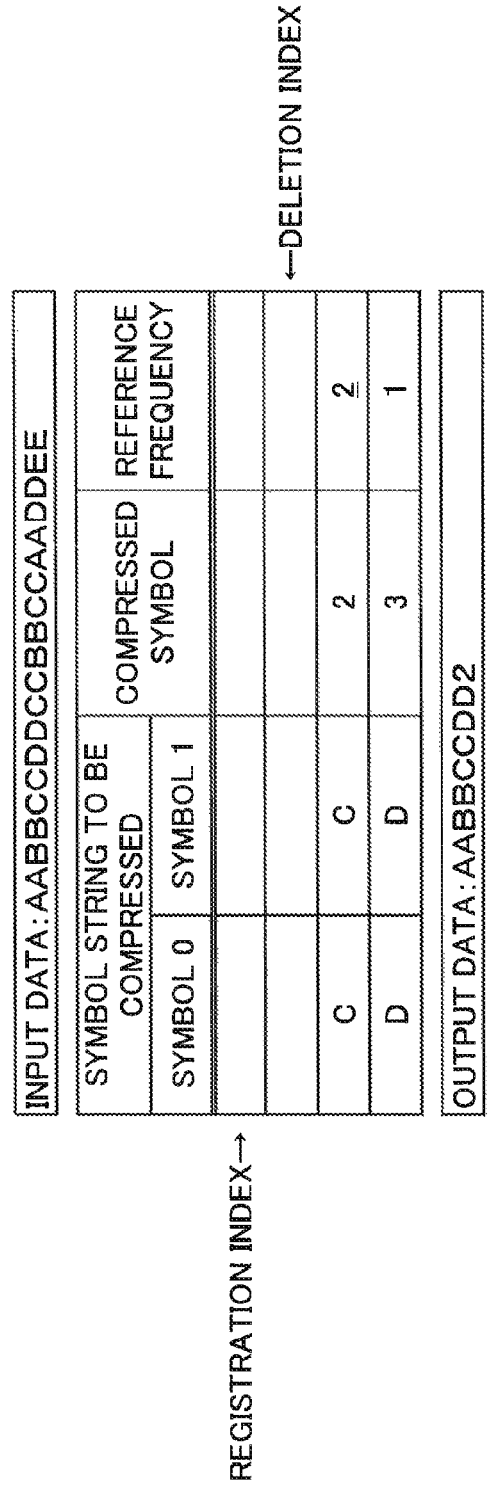

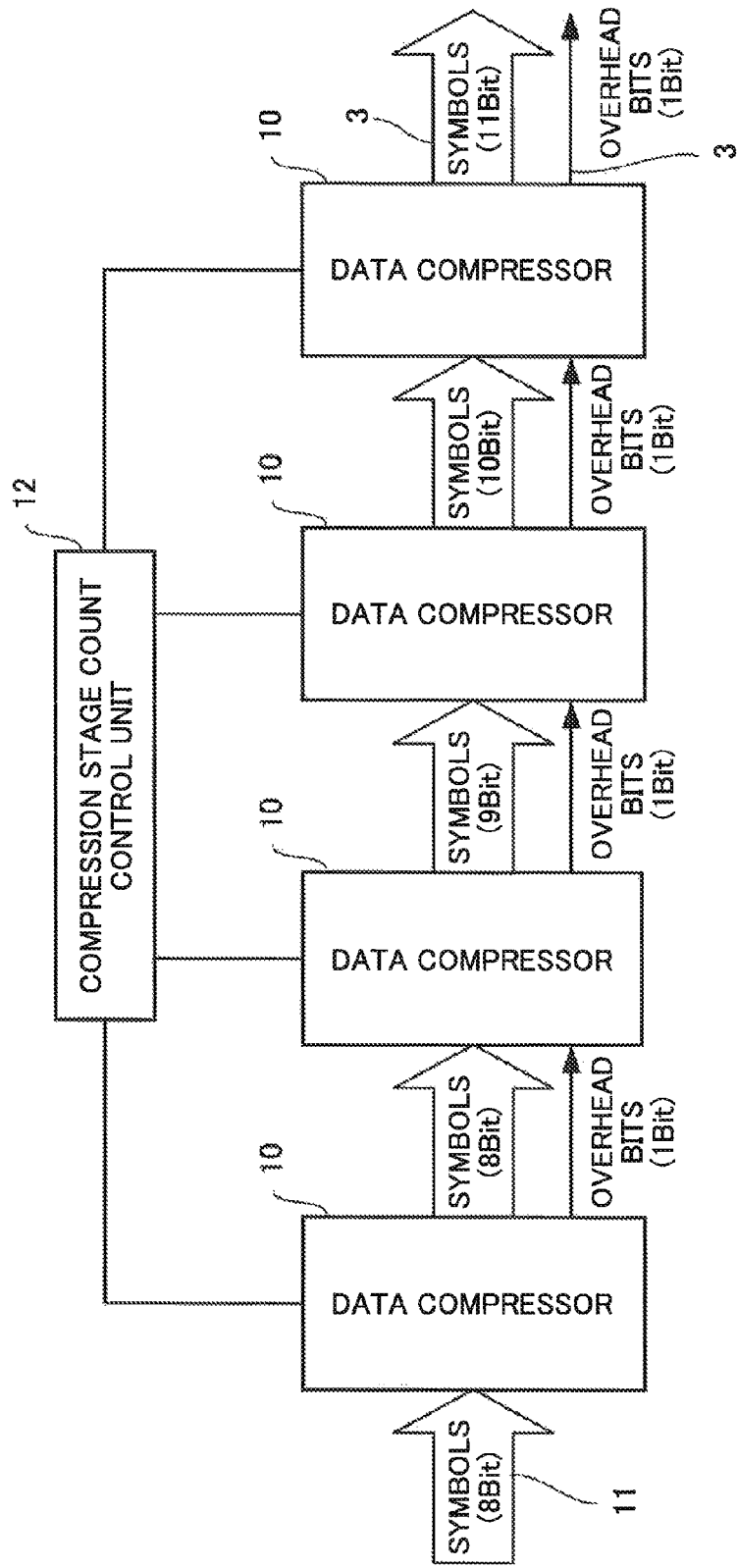

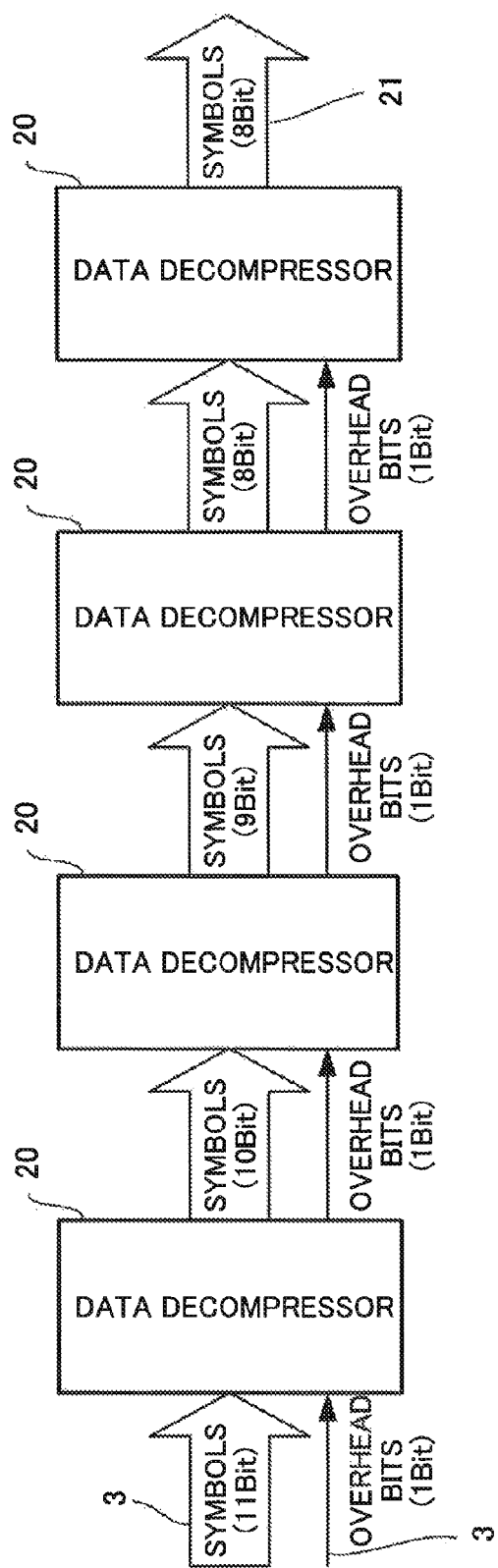

FIG.27A

INPUT DATA: AABBCCDDCCBBAACC

| SYMBOL STRING TO BE COMPRESSED | | COMPRESSED SYMBOL | REFERENCE FREQUENCY |
|---|---|---|---|
| SYMBOL 0 | SYMBOL 1 | | |
| | | | |
| | | | |
| | | | |
| | | | |

OUTPUT DATA:

FIG.27B

INPUT DATA: AABBCCDDCCBBAACC

| SYMBOL STRING TO BE COMPRESSED | | COMPRESSED SYMBOL | REFERENCE FREQUENCY |
|---|---|---|---|
| SYMBOL 0 | SYMBOL 1 | | |
| A | A | 0 | 1 |
| | | | |
| | | | |
| | | | |

OUTPUT DATA: AA

FIG.27C

INPUT DATA: AABBCCDDCCBBAACC

| SYMBOL STRING TO BE COMPRESSED | | COMPRESSED SYMBOL | REFERENCE FREQUENCY |
|---|---|---|---|
| SYMBOL 0 | SYMBOL 1 | | |
| A | A | 0 | 1 |
| | | | |
| | | | |
| | | | |

OUTPUT DATA: AABBCC

FIG.27D

| INPUT DATA: AABBCCDDCCBBAACC ||||
|---|---|---|---|
| SYMBOL STRING TO BE COMPRESSED || COMPRESSED SYMBOL | REFERENCE FREQUENCY |
| SYMBOL 0 | SYMBOL 1 | | |
| A | A | 0 | 1 |
| D | D | 1 | 1 |
|  |  |  |  |
|  |  |  |  |

| OUTPUT DATA: AABBCCDD |
|---|

FIG.27E

| INPUT DATA: AABBCCDDCCBBAACC ||||
|---|---|---|---|
| SYMBOL STRING TO BE COMPRESSED || COMPRESSED SYMBOL | REFERENCE FREQUENCY |
| SYMBOL 0 | SYMBOL 1 | | |
| A | A | 0 | 1 |
| D | D | 1 | 1 |
|  |  |  |  |
|  |  |  |  |

| OUTPUT DATA: AABBCCDDCCBB |
|---|

FIG.27F

| INPUT DATA: AABBCCDDCCBBAACC ||||
|---|---|---|---|
| SYMBOL STRING TO BE COMPRESSED || COMPRESSED SYMBOL | REFERENCE FREQUENCY |
| SYMBOL 0 | SYMBOL 1 | | |
| A | A | 0 | 2 |
| D | D | 1 | 1 |
|  |  |  |  |
|  |  |  |  |

| OUTPUT DATA: AABBCCDDCCBB0 |
|---|

FIG.28A

| INPUT DATA: AABBCCDDCCBB0 |||||

| DECODED SYMBOL STRING || COMPRESSED SYMBOL | REFERENCE FREQUENCY |
|---|---|---|---|
| SYMBOL 0 | SYMBOL 1 | | |
| | | | |
| | | | |
| | | | |
| | | | |

| OUTPUT DATA: |

FIG.28B

| INPUT DATA: AABBCCDDCCBB0 |||||

| DECODED SYMBOL STRING || COMPRESSED SYMBOL | REFERENCE FREQUENCY |
|---|---|---|---|
| SYMBOL 0 | SYMBOL 1 | | |
| A | A | 0 | 1 |
| | | | |
| | | | |
| | | | |

| OUTPUT DATA: AA |

FIG.28C

| INPUT DATA: AABBCCDDCCBB0 |||||

| DECODED SYMBOL STRING || COMPRESSED SYMBOL | REFERENCE FREQUENCY |
|---|---|---|---|
| SYMBOL 0 | SYMBOL 1 | | |
| A | A | 0 | 1 |
| | | | |
| | | | |
| | | | |

| OUTPUT DATA: AABBCC |

FIG.28D

| INPUT DATA: AABBCCDDCCBB0 |||||
|---|---|---|---|

| DECODED SYMBOL STRING || COMPRESSED SYMBOL | REFERENCE FREQUENCY |
|---|---|---|---|
| SYMBOL 0 | SYMBOL 1 | | |
| A | A | 0 | 1 |
| D | D | 1 | 1 |
| | | | |
| | | | |

| OUTPUT DATA: AABBCCDD |
|---|

FIG.28E

| INPUT DATA: AABBCCDDCCBB0 |
|---|

| DECODED SYMBOL STRING || COMPRESSED SYMBOL | REFERENCE FREQUENCY |
|---|---|---|---|
| SYMBOL 0 | SYMBOL 1 | | |
| A | A | 0 | 1 |
| D | D | 1 | 1 |
| | | | |
| | | | |

| OUTPUT DATA: AABBCCDDCCBB |
|---|

FIG.28F

| INPUT DATA: AABBCCDDCCBB0 |
|---|

| DECODED SYMBOL STRING || COMPRESSED SYMBOL | REFERENCE FREQUENCY |
|---|---|---|---|
| SYMBOL 0 | SYMBOL 1 | | |
| A | A | 0 | 2 |
| D | D | 1 | 1 |
| | | | |
| | | | |

| OUTPUT DATA: AABBCCDDCCBBAA |
|---|

DATA COMPRESSION/DECOMPRESSION SYSTEM, DATA COMPRESSION METHOD AND DATA DECOMPRESSION METHOD, AND DATA COMPRESSOR AND DATA DECOMPRESSOR

CROSS-REFERENCE TO RELATED APPLICATIONS

The present application claims priority under 35 U.S.C. § 119 to Japanese Patent Application No. 2015-063449, filed Mar. 25, 2015. The contents of this application are incorporated herein by reference in their entirety.

TECHNICAL FIELD

The present invention relates to a data compression/decompression system, a data compression method and a data decompression method, and a data compressor and a data decompressor.

BACKGROUND ART

Under the environment of recent years in which data streams flow on a network, in order to perform real-time processing on stream data forming data streams, there is a demand for reduction in time of data transmission between various entities that transmit/receive the stream data. Example of the entities include various communication equipment pieces (terminal apparatuses and relay apparatuses) connected to the network. Also, data streams flow among electronic circuit chips that perform processing on various stream data, such as processors, LSIs (large-scale integrated circuits) and FPGAs (field-programmable gate arrays) incorporated in communication equipment pieces. An electronic circuit chip is one of the entities, and communications between the entities include not only communications between communication equipment pieces, but also communications between electronic circuit chips inside a communication equipment piece (what is called internal communications).

In recent years, there is a trend toward an increase in stream data amount. As a method for efficiently transmitting a certain amount of stream data from the transmission side to the reception side, increasing a frequency (expanding a transmission band) of a transmission path connecting entities or connecting entities via a plurality of transmission paths to transmit stream data in parallel may be contemplated. However, these methods will eventually reach physical and frequency limits.

Therefore, a technique in which stream data is compressed in a transmission-side apparatus has been proposed. In other words, a data transmission efficiency is improved by reduction in data transmission time resulting from reduction in transmission data amount. For example, data compressors including a conversion unit that if two or more consecutive symbols are registered, converts the two or more symbols into one symbol, and an output unit that if the two or more symbols are converted into one symbol by the conversion unit, outputs the one symbol, and if not, outputs the two or more symbols is proposed (for example, Patent document 1). Accordingly, compression and decompression processing can be performed with a processing delay within a certain period of time.

Also, techniques in which input data are subjected to counting processing in blocks to count the number of times of generation for each of data to be coded, and if there are data to be coded, the number of times of generation of each of which is 0, the numbers of times of generation are evenly incremented by an integer of no less than 1, and based on an adaptive Huffman coding table created based on the number of times of generation in a certain block, variable-length coding is performed for a next block have also been proposed (for example, Patent document 2).

CITATION LIST

Patent Document

[Patent document 1] Japanese Patent Laid-Open No. 2014-236449
[Patent document 2] Japanese Patent Laid-Open No. 7-7436

SUMMARY OF THE INVENTION

Problems to be Solved by the Invention

For example, in the aforementioned technique described in Patent document 1, it is necessary that a conversion table (lookup table) be shared in advance between a transmitter and a receiver. Also, of information stored as correspondences between pre-conversion and post-conversion data symbols (hereinafter also simply referred to as "symbols"), appearance of more pre-conversion symbols in a data stream more enhances a compression efficiency; however, particularly, if each of a data compressor and a data decompressor is provided by hardware, a capacity for storage of the correspondences between pre-conversion and post-conversion symbols is limited. Therefore, it is difficult to provide conversion rules that can be applied in common to data streams having different symbol appearance tendencies.

The present invention has been made in view of such problems, and an object of the present invention is to, where transfer data is compressed in real time, create and apply a conversion rule conforming to a tendency of the data.

Means for Solving the Problems

A data compression/decompression system according to an aspect of the present invention processes a data string in units of symbols, each of the symbols being data having a fixed length, to compress and decompress the data string before and after transfer of the data string between apparatuses. A transmission-side apparatus searches a conversion table in which an entry indicating a correspondence between two or more pre-conversion symbols and one post-conversion symbol is registered, and if it is determined that two or more consecutive symbols in the data string are not registered as two or more pre-conversion symbols, registers an entry in which the two or more consecutive symbols are registered as two or more pre-conversion symbols, in the conversion table, and outputs the two or more consecutive symbols without conversion, and if two or more consecutive symbols in the data string are registered as two or more pre-conversion symbols in an entry in the conversion table, converts the two or more consecutive symbols into one post-conversion symbol, the one post-conversion symbol being in correspondence with the two or more consecutive symbols in the entry, and outputs the post-conversion one symbol. On the other hand, a reception-side apparatus searches a conversion table in which an entry indicating a correspondence between a pre-decompression symbol and two or more post-decompression symbols is registered, and if it is determined that a symbol included in the data string is not registered as a pre-decompression symbol, registers an entry in which the symbol and a predetermined number of subsequent symbols included in the data string are registered as two or more post-decompression symbols, in the conversion table, and outputs the symbol and the predetermined number of subsequent symbols included in the data string without conversion, and if a symbol included in the data string is registered as a pre-decompression symbol in an entry in the conversion table, converts the symbol included in the data string into two or more post-decompression symbols, the two or more post-decompression symbols being in correspondence with the symbol in the entry, and outputs the two or more post-decompression symbols.

A data compression method according to another aspect of the present invention causes a computer to process a data string in units of symbols, each of the symbols being data having a fixed length, to compress the data string. The method includes: searching a conversion table in which an entry indicating a correspondence between two or more pre-conversion symbols and one post-conversion symbol is registered, and if it is determined that two or more consecutive symbols in the data string are not registered as two or more pre-conversion symbols, registering an entry in which the two or more consecutive symbols are registered as two or more pre-conversion symbols, in the conversion table, and outputting the two or more consecutive symbols without conversion; and if two or more consecutive symbols in the data string are registered as two or more pre-conversion symbols in an entry in the conversion table, converting the two or more consecutive symbols into one post-conversion symbol, the one post-conversion symbol being in correspondence with the two or more consecutive symbols in the entry, and outputting the one post-conversion symbol.

Also, a data decompression method according to another aspect of the present invention causes a computer to process a data string received from an apparatus that is a communication partner, in units of symbols, each of the symbols being a data having a fixed length, to decompress the data string. The method includes: searching a conversion table in which an entry indicating a correspondence between a pre-decompression symbol and two or more post-decompression symbols is registered, and if it is determined that a symbol included in the data string is not registered as a pre-decompression symbol, registering an entry in which the symbol and a predetermined number of subsequent symbols included in the data string are registered as two or more post-decompression symbols, in the conversion table, and outputting the symbol and the predetermined number of subsequent symbols included in the data string without conversion; and if a symbol included in the data string is registered as a pre-decompression symbol in an entry in the conversion table, converting the symbol included in the data string into two or more post-decompression symbols, the two or more post-decompression symbols being in correspondence with the symbol in the entry, and outputting the two or more post-decompression symbols.

Effects of the Invention

The present invention enables creation and application of a conversion rule conforming with a tendency of stream data.

BRIEF DESCRIPTION OF THE DRAWINGS

FIG. 3 is a diagram illustrating an example of entries registered in a conversion table in a data compressor.

FIG. 4 is a processing flow diagram illustrating an example of compression processing according to Embodiment 1.

FIG. 5A is a diagram for describing registration and update of entries in a conversion table.

FIG. 5B is a diagram for describing registration and update of entries in a conversion table.

FIG. 5C is a diagram for describing registration and update of entries in a conversion table.

FIG. 5D is a diagram for describing registration and update of entries in a conversion table.

FIG. 5E is a diagram for describing registration and update of entries in a conversion table.

FIG. 5F is a diagram for describing registration and update of entries in a conversion table.

FIG. 5G is a diagram for describing registration and update of entries in a conversion table.

FIG. 5H is a diagram for describing registration and update of entries in a conversion table.

FIG. 5I is a diagram for describing registration and update of entries in a conversion table.

FIG. 7 is a diagram illustrating an example of entries registered in a conversion table in a data decompressor.

FIG. 8 is a processing flow diagram illustrating an example of decompression processing according to Embodiment 1.

FIG. 9A is a diagram for describing registration and update of entries in a conversion table.

FIG. 9B is a diagram for describing registration and update of entries in a conversion table.

FIG. 9C is a diagram for describing registration and update of entries in a conversion table.

FIG. 9D is a diagram for describing registration and update of entries in a conversion table.

FIG. 9E is a diagram for describing registration and update of entries in a conversion table.

FIG. 9F is a diagram for describing registration and update of entries in a conversion table.

FIG. 9G is a diagram for describing registration and update of entries in a conversion table.

FIG. 9H is a diagram for describing registration and update of entries in a conversion table.

FIG. 9I is a diagram for describing registration and update of entries in a conversion table.

FIG. 10 is a processing flow diagram illustrating an example of compression processing according to Embodiment 1.

FIG. 11A is a diagram for describing update of a conversion table according to Embodiment 2.

FIG. 11B is a diagram for describing update of a conversion table according to Embodiment 2.

FIG. 11C is a diagram for describing update of a conversion table according to Embodiment 2.

FIG. 11D is a diagram for describing update of a conversion table according to Embodiment 2.

FIG. 13A is a diagram for describing update of a conversion table according to Embodiment 2.

FIG. 13B is a diagram for describing update of a conversion table according to Embodiment 2.

FIG. 13C is a diagram for describing update of a conversion table according to Embodiment 2.

FIG. 13D is a diagram for describing update of a conversion table according to Embodiment 2.

FIG. 15A is a diagram for describing update of a conversion table according to Embodiment 3.

FIG. 15B is a diagram for describing update of a conversion table according to Embodiment 3.

FIG. 15C is a diagram for describing update of a conversion table according to Embodiment 3.

FIG. 15D is a diagram for describing update of a conversion table according to Embodiment 3.

FIG. 17A is a diagram for describing update of a conversion table according to Embodiment 3.

FIG. 17B is a diagram for describing update of a conversion table according to Embodiment 3.

FIG. 17C is a diagram for describing update of a conversion table according to Embodiment 3.

FIG. 17D is a diagram for describing update of a conversion table according to Embodiment 3.

FIG. 20A is a diagram for describing registration and update of entries in a conversion table according to Embodiment 5.

FIG. 20B is a diagram for describing registration and update of entries in a conversion table according to Embodiment 5.

FIG. 20C is a diagram for describing registration and update of entries in a conversion table according to Embodiment 5.

FIG. 20F is a diagram for describing registration and update of entries in a conversion table according to Embodiment 5.

FIG. 20G is a diagram for describing registration and update of entries in a conversion table according to Embodiment 5.

FIG. 21 is a block diagram illustrating an example of a data compression apparatus including data compressors connected at multiple stages, according to Embodiment 6.

FIG. 22 is a block diagram illustrating an example of a data decompression apparatus including data decompressors connected at multiple stages, according to Embodiment 6.

FIG. 27A is a diagram for describing registration and update of entries in a conversion table according to Embodiment 9.

FIG. 27B is a diagram for describing registration and update of entries in a conversion table according to Embodiment 9.

FIG. 27C is a diagram for describing registration and update of entries in a conversion table according to Embodiment 9.

FIG. 27D is a diagram for describing registration and update of entries in a conversion table according to Embodiment 9.

FIG. 27E is a diagram for describing registration and update of entries in a conversion table according to Embodiment 9.

FIG. 27F is a diagram for describing registration and update of entries in a conversion table according to Embodiment 9.

FIG. 28A is a diagram for describing registration and update of entries in a conversion table according to Embodiment 9.

FIG. 28B is a diagram for describing registration and update of entries in a conversion table according to Embodiment 9.

FIG. 28C is a diagram for describing registration and update of entries in a conversion table according to Embodiment 9.

FIG. 28D is a diagram for describing registration and update of entries in a conversion table according to Embodiment 9.

FIG. 28E is a diagram for describing registration and update of entries in a conversion table according to Embodiment 9.

FIG. 28F is a diagram for describing registration and update of entries in a conversion table according to Embodiment 9.

MODE FOR CARRYING OUT THE INVENTION

Embodiments of the present invention will be described below with reference to the drawings. However, each of the embodiments is a mere example of the present invention, and the configuration of the present invention is not limited to those of the below examples.

Embodiment 1

Figure 1:
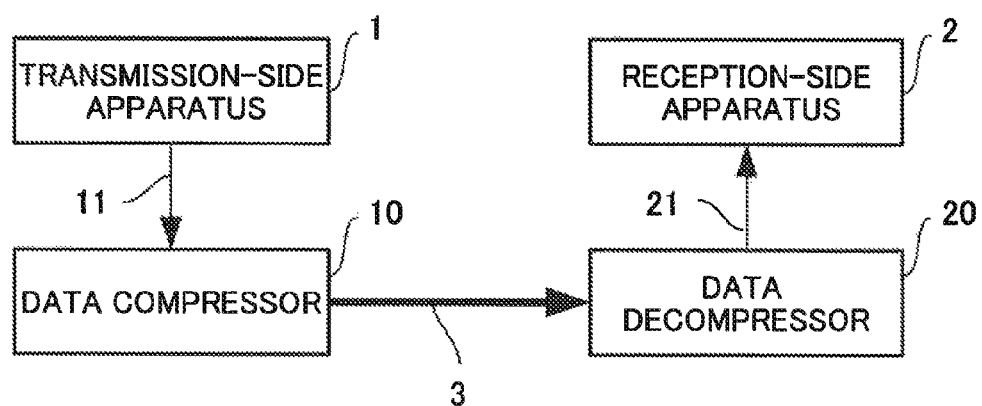
FIG. 1 is a diagram illustrating a configuration of a data compression/decompression system.

FIG. 1 is a diagram schematically illustrating a data compression/decompression system. In FIG. 1, a data compression/decompression system includes a transmission-side apparatus 1, a data compressor 10 provided for the transmission-side apparatus 1, the data compressor 10 being connected to the transmission-side apparatus 1 via a signal wire 11, a reception-side apparatus 2, and a data decompressor 20 provided for the reception-side apparatus 2, the data decompressor 20 being connected to the reception-side apparatus 2 via a signal wire 21. Also, the data compressor 10 and the data decompressor 20 are connected via a transmission path 3.

The data compressor 10 performs compression processing on data (for example, stream data) to be transmitted from the transmission-side apparatus 1 to the reception-side apparatus 2 and outputs the compressed data. Also, the compressed data reaches the data decompressor 20 through the transmission path 3. The data decompressor 20 performs decompression processing for restoring the compressed data to the original data, and the original data is supplied to the reception-side apparatus 2. As a result of the compression processing being performed, an amount of data sent out to the transmission path 3 is reduced, and thus, time necessary to transmit data of a certain size from the transmission-side apparatus 1 to the reception-side apparatus 2 is reduced compared to a case where no compression processing is performed.

The data compression/decompression system may be applied to communication between communication equipment pieces or may be applied to communication between components inside a communication equipment piece (communication between electronic circuit chips such as what is called "internal communication"). Where the data compression/decompression system is applied to communication between communication equipment pieces, for example, the data compressor 10 is incorporated in a transmission-side communication equipment piece, and the data decompressor 20 is incorporated in a reception-side communication equipment piece. Also, where the data compression/decompression system is applied to internal communication, for example, each of the data compressor 10 and the data decompressor 20 is incorporated as a component in a communication equipment piece or any of various information processing apparatuses (computers).

Here, if communication equipment pieces perform bidirectional communication, a configuration in which the data compressor 10 and the data decompressor 20 is incorporated in each of the transmission-side and reception-side communication equipment pieces, and data compression/decompression is performed in each of upstream communication and downstream communication may be employed.

<Data Compressor>

Figure 2:
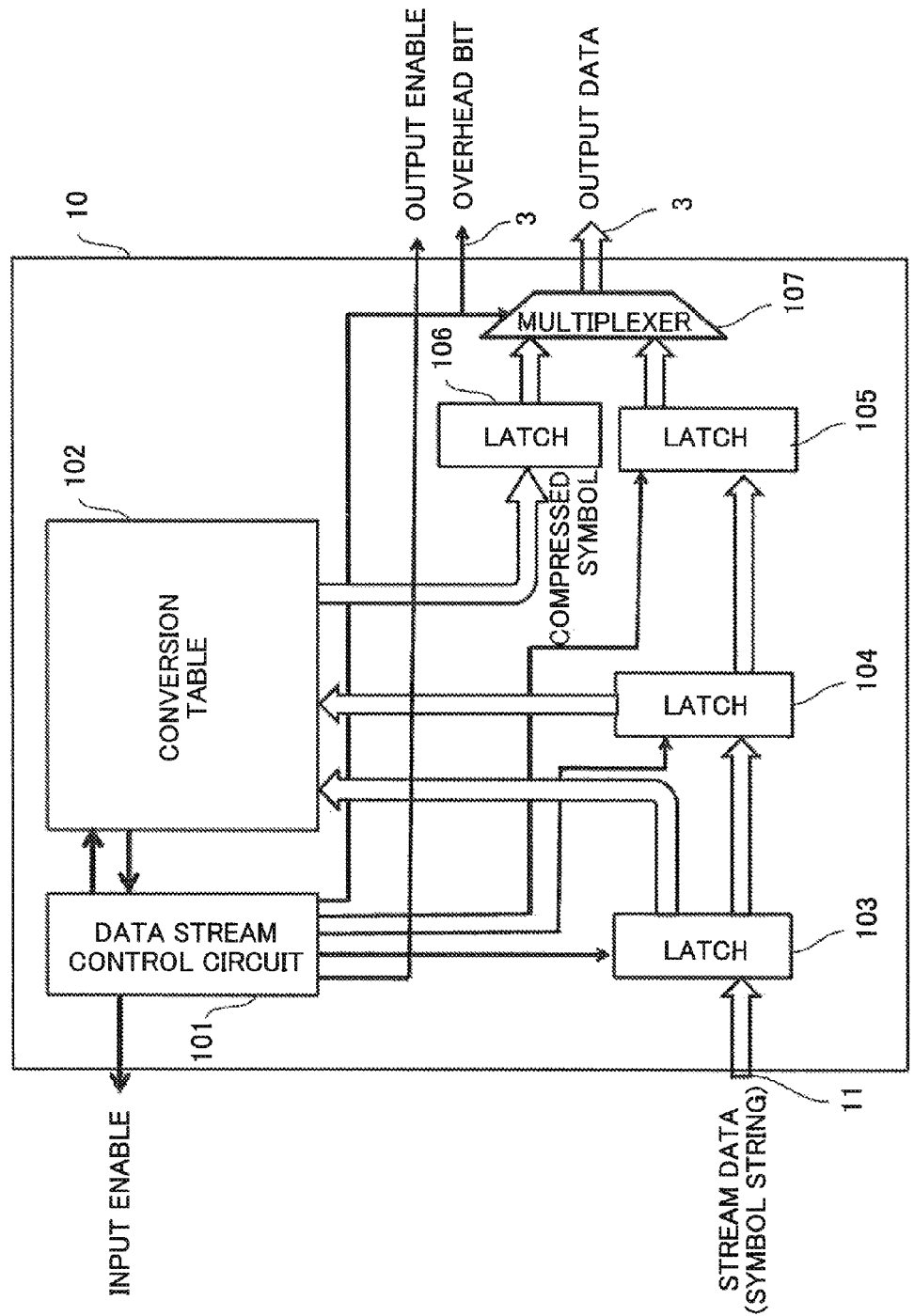
FIG. 2 is a functional block diagram illustrating an example of a data compressor.

FIG. 2 is a block diagram illustrating an example of the data compressor 10 illustrated in FIG. 1. The data compressor 10 performs lossless compression processing (referred to as "coding processing") on stream data input from the transmission-side apparatus 1 and outputs stream data that is at least partially compressed. Here, a format of the stream data may be a text format or a binary format. Also, the data compressor 10 treats stream data as a string of symbols that are processing units of a fixed length. A symbol has an arbitrary size, which can be, for example, one byte (8 bits).

Data compression processing is performed by converting a string of consecutive data symbols (for example, two symbols, which is also referred to as "symbol pair") into a compressed symbol having a size that is smaller than that of the symbol string (for example, one symbol) according to a conversion table (also referred to as "lookup table") that sets conversion rules for predetermined symbol strings included in stream data. Also, the data compressor 10 performs what is called dynamic coding (also referred to as "adaptive coding"). In other words, the data compressor 10 performs data compression processing, and creates and changes the conversion rules based on a tendency of appearance of symbols included in the stream data.

More specifically, the data compressor 10 includes a data stream control circuit 101, a conversion table 102, latches 103 to 106 and a multiplexer 107, which are connected via signal wires. The data stream control circuit 101 outputs enable signals to other components to cause symbols included in stream data to be held in data latches (also simply referred to as "latches") or to cause the conversion table 102 to be searched or updated. Here, the data stream control circuit 101 may be formed by, for example, an LSI (large-scale integration), an ASIC (application-specific integrated circuit) or a PLD (programmable logic device, for example, an FPGA (field-programmable gate array)). Also, the data stream control circuit 101 transmits/receives an input enable signal and an output enable signal, respectively, to transmit data in synchronization with another apparatus. The components of the data compressor 10 operate in synchronization based on a non-illustrated clock signal.

The conversion table 102 is a storage device including a circuit that holds an entry defining a correspondence between pre-conversion and post-conversion symbols and performs reading/writing of an entry. In other words, if an entry in which a symbol pair is registered as a compressed symbol string is included in the conversion table (that is, if there is a hit for the symbol pair in the conversion table), the conversion table 102 outputs a post-conversion compressed symbol. In this case, the conversion table 102 outputs a signal indicating whether or not there is a hit to the data stream control circuit 101, and the data stream control circuit 101 controls output from the multiplexer 107 and outputs a flag (also referred to as "overhead bit") indicating whether or not the symbol to be output is a post-conversion symbol. Also, the conversion table 102 adds and deletes an entry according to a frequency of appearance of a symbol included in stream data.

For the conversion table 102, for example, an associative memory (CAM (content addressable memory)) can be used. A CAM is a computer memory for high-speed search, the computer memory outputting an address corresponding to an input data word. Where a CAM is employed, if a symbol pair is input to the CAM as a data word and an entry is hit, the CAM outputs a compressed symbol as an address corresponding to the data word and outputs a true signal. The true signal is output to the data stream control unit as a signal indicating that an entry is hit. On the other hand, if no entry is hit, no address (compressed symbol) is output, and a false signal is output, from the CAM.

Here, the conversion table 102 may be a combination of a CAM and a RAM (random access memory). In this case, a compressed symbol is stored at an address in the RAM, which is output by the CAM, and the compressed symbol at the address is output to the latch 106. For the RAM, a DRAM or an SRAM may be selected, but in view of coordination with the CAM, it is preferable to select one that can operate at high speed.

Each of the latches 103 to 106 is, for example, a circuit formed by a D flip-flop. The latches 103 to 105 each hold stream data in units of symbols of a fixed length in an order of input of the stream data, and form a data pipeline. In other words, the latches 103 to 105 form a configuration for sequentially extracting symbol pairs from stream data. Then, with a combination of a symbol held in the latch 104 and a symbol held in the latch 103 as a symbol pair, whether or not an entry is hit in the conversion table 102 for the symbol pair is determined. The latch 106 holds a compressed symbol to be output if there is a hit in the conversion table 102 for the symbol pair.

The multiplexer 107 is a selector connected to the latch 105 and the latch 106, the selector outputting an original symbol pair or a compressed symbol. In other words, the multiplexer 107 outputs an original symbol pair or a compressed symbol according to whether or not an entry in a lookup table is hit for the symbol pair. More specifically, if a signal (true) to the effect that there is a hit in the conversion table is input from the data stream control circuit 101, the multiplexer 107 outputs a compressed symbol. On the other hand, if no signal to the effect that there is a hit in the conversion table (false) is input, the multiplexer 107 sequentially outputs two original symbols input from the original latch 105.

<Conversion Table>

FIG. 3 is an example of the conversion table 102 included in the data compressor 10. The conversion table 102 is a memory that store two symbols that are objects to be converted, a "symbol string to be compressed" (that is, pre-conversion symbol string), one symbol resulting from conversion by compression processing, a "compressed symbol" (that is, a post-conversion symbol), and a "reference frequency" representing the number of accesses to the compressed symbol in association with one another. Here, for sake of convenience, two symbols included in an input symbol string are referred to as "symbol 0" and "symbol 1". Also, the number of entries (also referred to as "records") registered in the conversion table 102 is a number limited according to a capacity of hardware forming the conversion table 102. In the present embodiment, entries are dynamically added and deleted; however, some kind of entry may be registered in advance at the time of start of processing. In the present embodiment, it is assumed that one English letter indicated in FIG. 3 represents one data symbol.

<Compression Processing>

FIG. 4 is a processing flow diagram schematically illustrating steps of compression processing according to the present embodiment. First, the data stream control circuit 101 in the data compressor 10 resets entries in the conversion table 102 (FIG. 4: S1). In the present step, for example, all entries in the conversion table 102 may be deleted or a predetermined entry may be registered in advance. Also, the processing in the present step may be performed, for example, each time transfer of one file is started in the transmission-side apparatus 1.

Also, the latch 103 and the latch 104 in the data compressor 10 extract a symbol pair from stream data (S2). Then, the conversion table 102 in the data compressor 10 searches entries as to whether or not the symbol pair is registered as a symbol string to be non-compressed (S3).

Then, if an entry holding the symbol pair as a symbol string to be compressed is registered in the conversion table 102 (S4: YES), the conversion table 102 outputs a compressed symbol registered in the entry to the latch 106, and the data stream control circuit 101 causes the multiplexer 107 to output the compressed symbol held by the latch 106 (S5).

On the other hand, if no entry holding the symbol pair as a symbol string to be compressed is registered in the conversion table 102 (S4: NO), the data stream control circuit 101 causes the multiplexer 107 to sequentially output two symbols transmitted to the latch 105 (that is, the symbol pair extracted in S2) (S6). Also, the conversion table 102 registers an entry holding the symbol pair as a symbol string to be compressed (S7).

Then, after S5 or S7, if a subsequent symbol pair is included in the stream data (S8: YES), the processing returns to S2 and is repeated. On the other hand, if no subsequent symbol pair is included in the stream data (S8: NO), the compression processing ends. Here, if the stream data ends with one symbol not forming a symbol pair, the symbol is output as it is. Here, the above-described processing flow is an example, and parts of the processing may be interchanged or performed in parallel. For example, the order of S6 and S7 may be reversed.

<Creation and Update of Conversion Table>

Next, a specific example of addition of entries to the conversion table 102 will be described with reference to FIGS. 5A to 5I. FIGS. 5A to 5I are diagrams for describing creation and update of the conversion table. In this example, it is assumed that stream data (referred to as "input data") "AABBCCDDCCBBCCAA" is sent from the transmission-side apparatus 1 to the reception-side apparatus 2. Also, the data compressor 10 processes the input data on a two symbols-by-two symbols basis. In other words, the data compressor 10 performs the processing in units of "AA", "BB", "CC" . . . .

First, as illustrated in FIG. 5A, it is assumed that in an initial conversion table 102 before start of the processing, no entry is registered. Also, it is assumed that a maximum entry count (capacity) of the conversion table 102 is 4. Then, as illustrated in FIG. 5B, upon a head symbol pair "AA" of the input data being input, since no entry with "AA" registered as a symbol string to be compressed is included in the conversion table 102 (that is, no entry is hit in the conversion table), the data stream control circuit 101 outputs the symbol pair "AA" with no conversion. Also, an entry with the symbol pair "AA" registered as a symbol string to be compressed is added to the conversion table 102. Here, a value not overlapping a compressed symbol in any other entry is assigned to the entry as a compressed symbol. The compressed symbol may be, for example, an index affixed to the entry. In the example in FIG. 5B, "0" is registered as a compressed symbol. Also, 1 indicating the number of times of appearance of the symbol pair is registered as a reference frequency of the entry.

Next, as illustrated in FIG. 5C, a next symbol pair "BB" of the input data is input. At this time, also, no entry in the conversion table 102 is hit for "BB", "BB" is output as it is, and an entry with "BB" as a symbol string to be compressed is added to the conversion table 102. Also, in the added entry, "1" is registered as a compressed symbol, and 1 is registered as a reference frequency.

Likewise, as illustrated in FIG. 5D, upon a next symbol pair "CC" being input, "CC" is output as it is, a new entry is added to the conversion table 102. In the entry, "CC" is registered as a symbol string to be compressed, "2" is registered as a compressed symbol, and 1 is registered as a reference frequency. Also, as illustrated in FIG. 5E, upon a next symbol pair "DD" being input, "DD" is output as it is, and a new entry is registered in the conversion table 102. In the entry, "DD" is registered as a symbol string to be compressed, "3" is registered as a compressed symbol, and 1 is registered as a reference frequency of the entry.

Next, as illustrated in FIG. 5F, upon a next symbol pair "CC" being input, the relevant entry in the conversion table 102 is hit for "CC", and the compressed symbol "2" is obtained. In this case, the data stream control circuit 101 causes the multiplexer 107 to output the compressed symbol "2". At this time, two symbols each having a fixed length (symbol pair) included in the input data is converted into one symbol (compressed symbol) and the data is thus compressed. Also, the reference frequency of the entry is incremented by 1. Also, the data stream control circuit 101 outputs an overhead bit indicating that the output from the multiplexer 107 is a post-compression symbol to the transmission path 3.

Likewise, as illustrated in FIG. 5G, upon a next symbol pair "BB" being input, the relevant entry in the conversion table 102 is hit for "BB", and the compressed symbol "1" is obtained. Therefore, the symbol pair "BB" is converted into the compressed symbol "1" and output, and an overhead bit is output. Also, the reference frequency of the entry is incremented by 1. Also, as illustrated in FIG. 5H, when a next symbol pair "CC" is input, also, the relevant entry in the conversion table 102 is hit for "CC", and the compressed symbol "2" is obtained. Therefore, the symbol pair "CC" is converted into the compressed symbol "2" and output, and the reference frequency of the entry is incremented by 1. Then, as illustrated in FIG. 5I, when a next symbol pair "AA" is input, also, the relevant entry in the conversion table 102 is hit for "AA", and the compressed symbol "0" is obtained. Therefore, the symbol pair "AA" is converted into the compressed symbol "0" and output, and the reference frequency of the entry is incremented by 1.

According to the above-described data compressor 10, an amount of data flowing on the transmission path 3 can be reduced by the amount of replacement of each of symbol pairs with one compressed symbol. Also, e.g., setting a unit of processing as a symbol having a fixed length enables time necessary for processing to be suppressed to be equal to or lower than a certain period of time. Therefore, the data compressor 10 can be provided by hardware, for example, such as illustrated in FIG. 2. Also, since entries are added to a conversion table based on a tendency of appearance of symbols included in input data, there is no need to provide a conversion table in advance. As described above, where stream data is compressed in real time, conversion rules according to a tendency of stream data can be created and applied.

<Data Decompressor>

Figure 6:
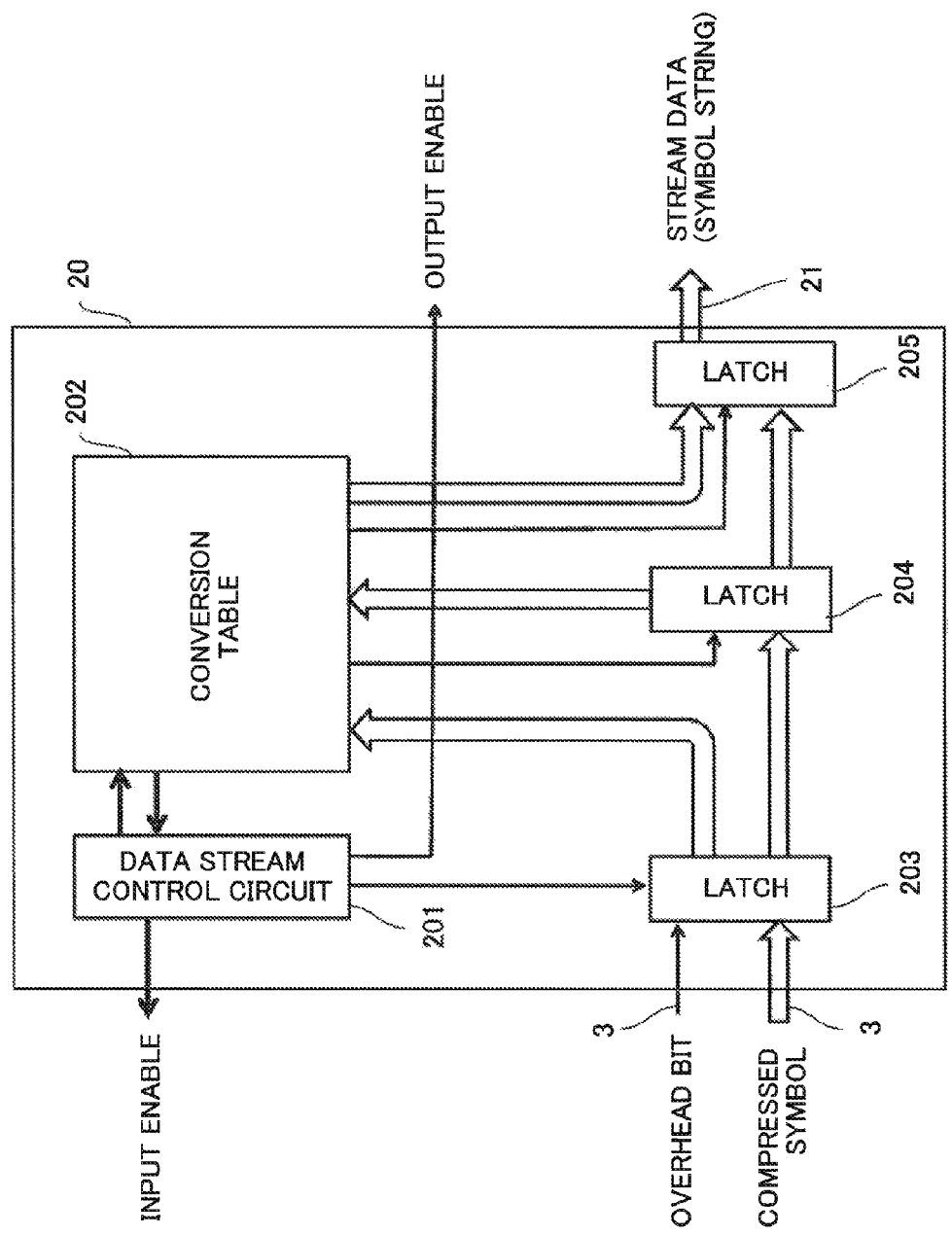
FIG. 6 is a functional block diagram illustrating an example of a data decompressor.

FIG. 6 is a block diagram illustrating an example of the data decompressor 20 illustrated in FIG. 1. The data decompressor 20 includes a data stream control circuit 201, a conversion table 202, and latches 203 to 205, which are connected via signal wires. The data stream control circuit 201 outputs enable signals to other components to perform control to cause latches to sequentially hold symbols included in stream data or cause the conversion table 202 to be searched or updated. Then, based on an overhead bit indicating whether or not one symbol input via the transmission path 3 is a post-compression symbol, the data stream control circuit 201 outputs a post-decoding symbol string from the conversion table 202 or outputs the symbol input via the transmission path 3 as it is. Here, the data stream control circuit 201 may be formed by, for example, an LSI, an ASIC or a PLD (for example, an FPGA). Also, the data stream control circuit 201 receives/transmits an input enable signal and an output enable signal, respectively, from/to other apparatuses, and transmits data in synchronization with the other apparatuses. The components of the data decompressor 20 operate in synchronization based on a non-illustrated clock signal. Also, the data decompressor 20 adds and updates entries corresponding to those on the data compressor 10 side to or in the conversion table 202 based on rules that are similar to those on the data compressor 10 side.

The conversion table 202 is a storage device including a circuit that holds an entry defining a correspondence between pre-decoding and post-decoding symbols and performs reading/writing of an entry. In other words, the conversion table 202 outputs a post-decoding symbol string registered in correspondence with a compressed symbol. Also, the conversion table 202 adds and deletes an entry according to a frequency of appearance of a symbol included in stream data.

Here, the conversion table 202 can be formed by, for example, a RAM. For example, with a compressed symbol as an address in the RAM, and a post-decoding symbol string (also referred to as "decoded symbol string") is stored in a data unit of the RAM. Also, a "reference frequency" can be formed by a RAM or a register.

Each of the latches 203 to 205 is a circuit formed by, for example, a D flip-flop. If a symbol transmitted to the latch 203 via the transmission path 3 is not a compressed symbol, the symbol is transmitted sequentially to the latch 204 and the latch 205. On the other hand, if the symbol transmitted to the latch 203 is a compressed symbol, the symbol is not transmitted to the latch 204 onwards, a decoded symbol string is output from the conversion table 202 to the latch 204 and the latch 205, and the decoded symbol string is sequentially output to the reception-side apparatus 2.

Also, if the symbol transmitted to the latch 203 via the transmission path 3 is not a compressed symbol (that is, an overhead bit is 0), the data stream control circuit 201 adds an entry with two sequentially-input symbols (symbol pair) as a decoded symbol string to the symbol conversion table 202. At this time, a compressed symbol is assigned based on rules that are similar to those on the data compressor 10 side. In the present embodiment, for the first time, the data compressor 10 outputs a symbol pair without conversion, and for the second time onwards of appearance of the symbol pair, the data compressor 10 converts and outputs the symbol pair, and thus, the data decompressor 20 also can register an entry corresponding to that of the data compressor 10 in the conversion table 202 at the first time of input of the symbol pair.

<Conversion Table>

FIG. 7 illustrates an example of the conversion table 202 included in the data decompressor 20. The conversion table 202 is a memory that stores two post-decoding symbols, a "decoded symbol string" (that is, a post-conversion symbol string in decompression processing), one symbol that is an object to be decoded, a "compressed symbol" (that is, pre-conversion symbol in decompression processing), and a "reference frequency" representing the number of accesses to the compressed symbol in association with one another. Here, for sake of convenience, two symbols included in a decoded symbol string are referred to as "symbol 0" and "symbol 1". Also, it is assumed that the number of entries (also referred to as "records") registered in the conversion table 202 is similar to that of the conversion table 102 in the data compressor 10. An entry that is the same as that in the conversion table 102 of the data compressor 10 may be registered in the conversion table 202 of the data decompressor 20 in advance at the time of start of processing.

<Decompression Processing>

FIG. 8 is a processing flow diagram schematically illustrating steps of decompression processing according to the present embodiment. First, the data stream control circuit 201 in the data decompressor 20 resets entries in the conversion table 202 (FIG. 8: S11). In the present step, for example, all entries in the conversion table 202 may be deleted or a predetermined entry may be registered in advance, but such entry is registered in correspondence with an entry in the conversion table 102 in the data compressor 10. The processing in the present step also may be performed, for example, each time transfer of one file is started in the transmission-side apparatus 1. Notification of such timing is provided by, for example, header information according to a predetermined protocol.

Also, the latch 203 in the data decompressor 20 extracts a symbol and an overhead bit from stream data (S12). Then, if the extracted symbol is a compressed symbol (S13: YES, that is, if the overhead bit is 1), the data stream control circuit 201 outputs a decoded symbol string from the conversion table 202 (S14).

On the other hand, if the extracted symbol is not a compressed symbol (S13: NO, that is, if the overhead bit is 0), the data stream control circuit 201 outputs two input symbols without conversion (S15). Also, an entry with the two symbols output in S15 as a decoded symbol string is registered in the conversion table 202 (S16). Here, as for the order of execution of the processing in S15 and the processing S16, the processing in S15 and the processing S16 may be performed in parallel or may be performed in reverse order.

Then, after S14 or S16, if a subsequent symbol is included in the stream data (S17: YES), the processing returns to S12 and is repeated. On the other hand, if no subsequent symbol pair is included in the stream data (S17: NO), the decompression processing ends.

<Creation and Update of Conversion Table>

Next, a specific example of addition of entries to the conversion table 202 will be described with reference to FIGS. 9A to 9I. FIGS. 9A to 9I are diagrams for describing creation and update of the conversion table in the data decompressor 20. In this example, it is assumed that stream data (referred to as "input data") "AABBCCDD2120" is sent to the data decompressor 20 via the transmission path 3.

First, as illustrated in FIG. 9A, it is assumed that in an initial conversion table 202 before start of the processing, no entry is registered. Also, it is assumed that a maximum entry count (capacity) of the conversion table 202 is also 4. Also, it is assumed that a head symbol "A" of the input data is input and 0 is input as an overhead bit. In other words, since the symbol "A" is not a compressed symbol, as illustrated in FIG. 9B, a symbol pair formed by the symbol jointly with a next symbol is read and an entry is registered in the conversion table 202. In the entry, a symbol pair "AA" is registered as a decoded symbol string and "0" is registered as a compressed symbol. Also, as a reference frequency of the entry, 1 indicating the number of times of appearance of the symbol is registered.

Next, as illustrated in FIG. 9C, a next symbol "B" of the input data is also determined as being not a compressed symbol, and a symbol pair "BB" is added to the conversion table 202. Also, in the added entry, "1" is registered as a compressed symbol, and 1 is registered as a reference frequency.

Likewise, as illustrated in FIG. 9D, a next symbol "C" is also determined as being not a compressed symbol, and a symbol pair "CC" is added to the conversion table 202. In the relevant entry, "CC" is registered as a decoded symbol string, "2" is registered as a compressed symbol, and 1 is registered as a reference frequency. Also, as illustrated in FIG. 9E, since a next symbol "D" is also not a compressed symbol, a symbol pair "DD" is registered in the conversion table 202. In the relevant entry, "DD" is registered as a decoded symbol string, "3" is registered as a compressed symbol, and 1 is registered as a reference frequency of the entry.

Subsequently, upon a next symbol "2" being input, 1 is input as an overhead bit. At this time, as illustrated in FIG. 9F, a decoded symbol string "CC" corresponding to the compressed symbol "2" is obtained from the conversion table 202. Therefore, the data stream control circuit 201 causes the latch 204 and the latch 205 to output decoded symbols "CC". In this way, compressed data can be restored to original data. Also, the reference frequency of the entry is incremented by 1.

Likewise, as illustrated in FIG. 9G, a next symbol "1" is converted into a decoded symbol string "BB" based on the relevant entry in the conversion table 202. Also, the reference frequency of the entry is incremented by 1. Also, as illustrated in FIG. 9H, a next symbol "2" is converted into a decoded symbol string "CC" based on the relevant entry in the conversion table 202. Also, the reference frequency of the entry is incremented by 1. Then, as illustrated in FIG. 9I, a next symbol "0" is converted into a decoded symbol string "AA" based on the relevant entry in the conversion table 202. Also, the reference frequency of the entry is incremented by 1.

According to the data decompressor 20 such as above, stream data compressed by the data compressor 10 can be decoded. Also, e.g., setting a unit of processing as a symbol having a fixed length enables time necessary for processing to be suppressed to be equal to or lower than a certain period of time. Therefore, the data decompressor 20 can be provided by hardware, for example, such as illustrated in FIG. 6. Also, since entries are added to a conversion table according to rules that are similar to those on data compressor 10 side based on a tendency of appearance of symbols included in the stream data, there is no need to provide a conversion table in advance. As described above, where stream data is decompressed in real time, conversion rules according to a tendency of stream data can be created and applied.

Embodiment 2

Next, an example of deletion of entries from a conversion table 102 in a data compressor 10 and a conversion table 202 in a data decompressor 20 will be described. In Embodiment 2, components that are in common to those of Embodiment 1 are provided with reference numerals that are the same as those of Embodiment 1 and description thereof will be omitted, and description will be described mainly on differences. In the present embodiment, when an entry is added to the conversion table 102 or the conversion table 202, if there is no free space, an entry is deleted. It is assumed that an object to be deleted is an entry holding a symbol pair whose frequency of appearance (that is, the "reference frequency" in the conversion table 202) is low as a symbol string to be compressed, based on frequencies of appearance of symbol pairs in the stream data. Here, it is assumed that an entry whose value of reference frequency is equal to or below a predetermined threshold value (also referred to as "deletion threshold value") is deleted. In the present embodiment, it is assumed that the deletion threshold value is determined as 1. Also, processing for deleting an entry from the conversion table 102 is controlled by, for example, the data stream control circuit 101 illustrated in FIG. 2.

<Compression Processing>

FIG. 10 is a processing flow diagram illustrating an example of compression processing according to the present embodiment. In the processing flow in FIG. 10, before processing for adding an entry to the conversion table (S7), if the conversion table has no free space, processing for deleting an entry is performed (S21). In the present step, an entry to be deleted is determined by a sequential search of the entire conversion table 102. Here, as for the order of execution of the processing in S6 and processing in S21 and S7, the processing in S6 and processing in S21 and S7 may be performed in parallel or may be performed in reverse order.

FIGS. 11A to 11D are diagrams for describing deletion of entries from the conversion table 102. For example, in the state illustrated in FIG. 11A, it is assumed that a symbol pair "EE" is input. In such case, no entry in the conversion table 102 is hit for the symbol pair "EE", and thus, the symbol pair "EE" is output as it is in S6 in FIG. 10. Then, since the conversion table 102 has no spare capacity to add a new entry, entry deletion is performed in S21 in FIG. 10. In the present step, values of reference frequencies in all entries registered in the conversion table 102 are sequentially read, and entries whose values of the reference frequencies are equal to or below a deletion threshold value of "1" are deleted. Here, if there is no entry whose value of the reference frequency is equal to or below the deletion threshold value, the values of the reference frequencies in all the entries registered in the conversion table 102 are sequentially decremented by 1, and all entries whose values of the reference frequencies become equal to or below the deletion threshold value are deleted. In the example in FIG. 11A, there is no entry whose reference frequency is equal to or below 1, and thus, as illustrated in FIG. 11B, the reference frequencies of all the entries are decremented by 1. Then, the reference frequencies of entries with "AA" and "BB" as respective symbol strings to be compressed become the deletion threshold value of "1", and thus, as indicated in S21 in FIG. 11C, the data stream control circuit 101 deletes the entries from the conversion table 102. Subsequently, as illustrated in FIG. 11D, the conversion table 102 is sequentially searched for free space, and an entry with the input symbol pair "EE" as a symbol string to be compressed is added to the conversion table 102 (FIG. 10: S7).

As described above, changing the content of the conversion table 102 according to a tendency of appearance of symbol pairs in stream data enables compression processing to be performed within an available memory capacity. Also, deletion and addition of entries in the conversion table 202 on the data decompressor 20 side based on rules that are similar to those of the conversion table 102 enables the data decompressor 20 to properly decompress compressed stream data.

<Decompression Processing>

Figure 12:
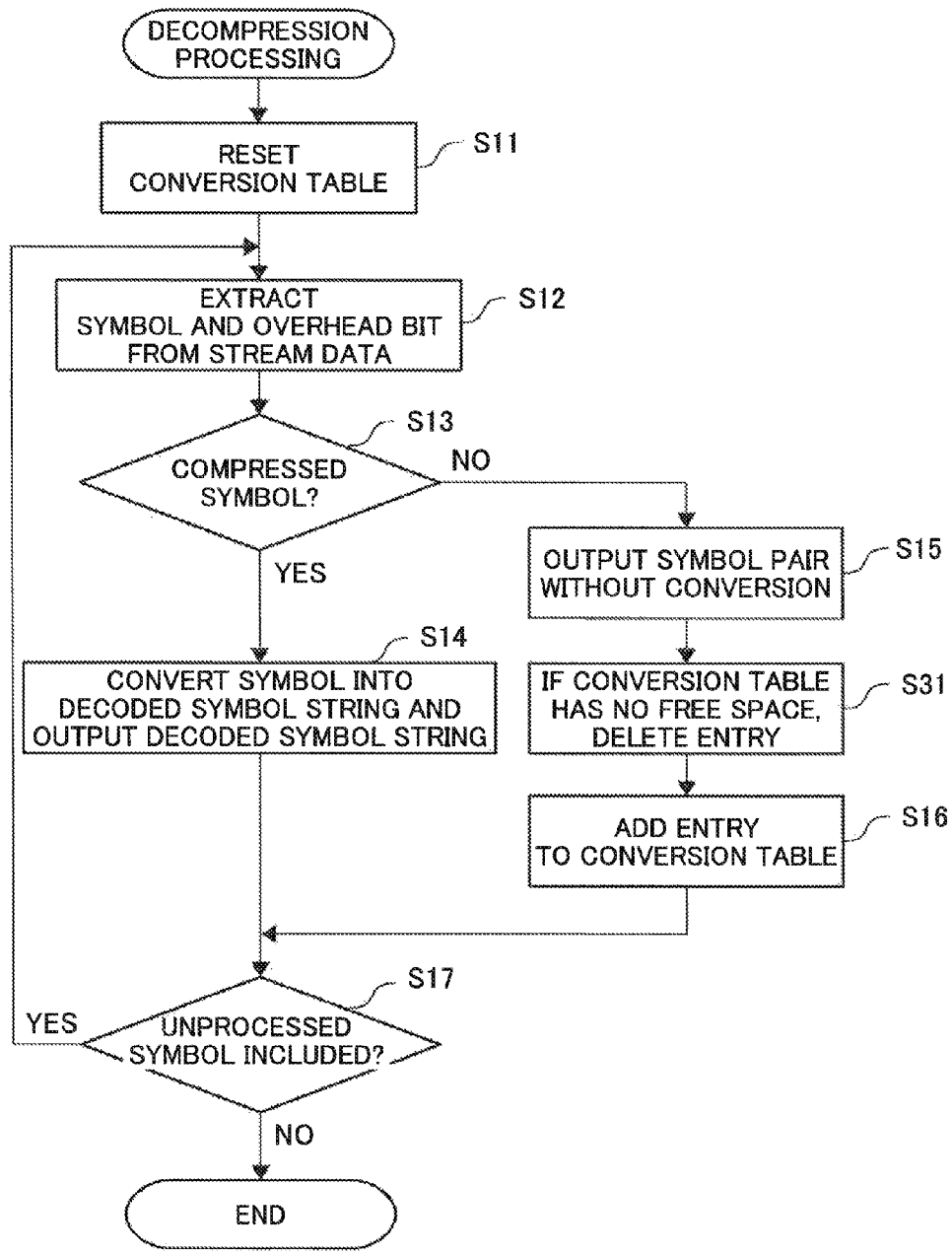
FIG. 12 is a processing flow diagram illustrating an example of decompression processing according to Embodiment 1.

FIG. 12 is a processing flow diagram illustrating an example of decompression processing according to the present embodiment. In the processing flow in FIG. 12, before processing for adding an entry to the conversion table (S16), if the conversion table has no free space, processing for deleting an entry (S31) is performed. In the present step, an entry to be deleted is determined by a sequential search of the entire conversion table 202.

FIGS. 13A to 13D are diagrams for describing deletion of entries from the conversion table 202. For example, it is assumed that a symbol pair "EE" is input in the entry state indicated in FIG. 13A. In such case, no entry in the conversion table 102 is hit for the symbol pair "EE", and thus, the symbol pair "EE" is output as it is in S15 in FIG. 12. Then, since the conversion table 102 has no spare capacity to add a new entry, entry deletion is performed in S31 in FIG. 12. In the present step, values of reference frequencies of all entries registered in the conversion table 102 are sequentially read, and entries whose value of the reference frequency are equal to or below a deletion threshold value of "1" are deleted. Here, as in FIG. 13A, if there is no entry whose values of the reference frequencies are equal to or below the deletion threshold value, the values of the reference frequencies in all the entries registered in the conversion table 102 are sequentially decremented by 1, and all entries whose values of the reference frequencies become equal to or below the deletion threshold value are deleted. In the example in FIG. 13A, there is no entry whose reference frequency is equal to or below 1, and thus, as illustrated in FIG. 13B, the reference frequencies are sequentially decremented by 1. Then, the reference frequencies of entries with "AA" and "BB" as respective symbol strings to be compressed become the deletion threshold value of "1", and thus, as illustrated in FIG. 13C, the data stream control circuit 201 deletes the entries from the conversion table 202. Subsequently, as illustrated in FIG. 13D, the conversion table 202 is sequentially searched for free space, and an entry with the input symbol pair "EE" as a symbol string to be compressed is added to the conversion table 202 (FIG. 12: S16).

As described above, if the conversion table 202 has no free space, the data decompressor 20 delete an entry from the conversion table 202 based on rules that are similar to those of the data compressor 10. In other words, an entry in the conversion table 102 in the data compressor 10 and an entry in the conversion table 202 in the data decompressor 20 are deleted and added at respective timings synchronized with each other. Therefore, even if conversion rules for symbols are changed, the data decompressor 20 can properly decompress post-compression stream data.

Embodiment 3

Next, another example of deletion of entries from a conversion table 102 in a data compressor 10 and a conversion table 202 in a data decompressor 20 will be described. In Embodiment 3, components that are in common to those of Embodiment 2 are provided with reference numerals that are the same as those of Embodiment 2 and description thereof will be omitted, and description will be described mainly on differences. In the present embodiment, also, when an entry is added to the conversion table 102 or the conversion table 202, if there is no free space, deletion of an entry is performed. In other words, a target of deletion is an entry holding a symbol pair whose frequency of appearance is low as a symbol string to be compressed, based on frequencies of appearance of symbol pairs in stream data. However, in the present embodiment, using a memory having a stack structure (also simply referred to as "stack"), the memory holding a predetermined number of symbol pairs recently input, a new symbol pair registered in the conversion table is preferentially deleted.

<Compression Processing>

Figure 14:
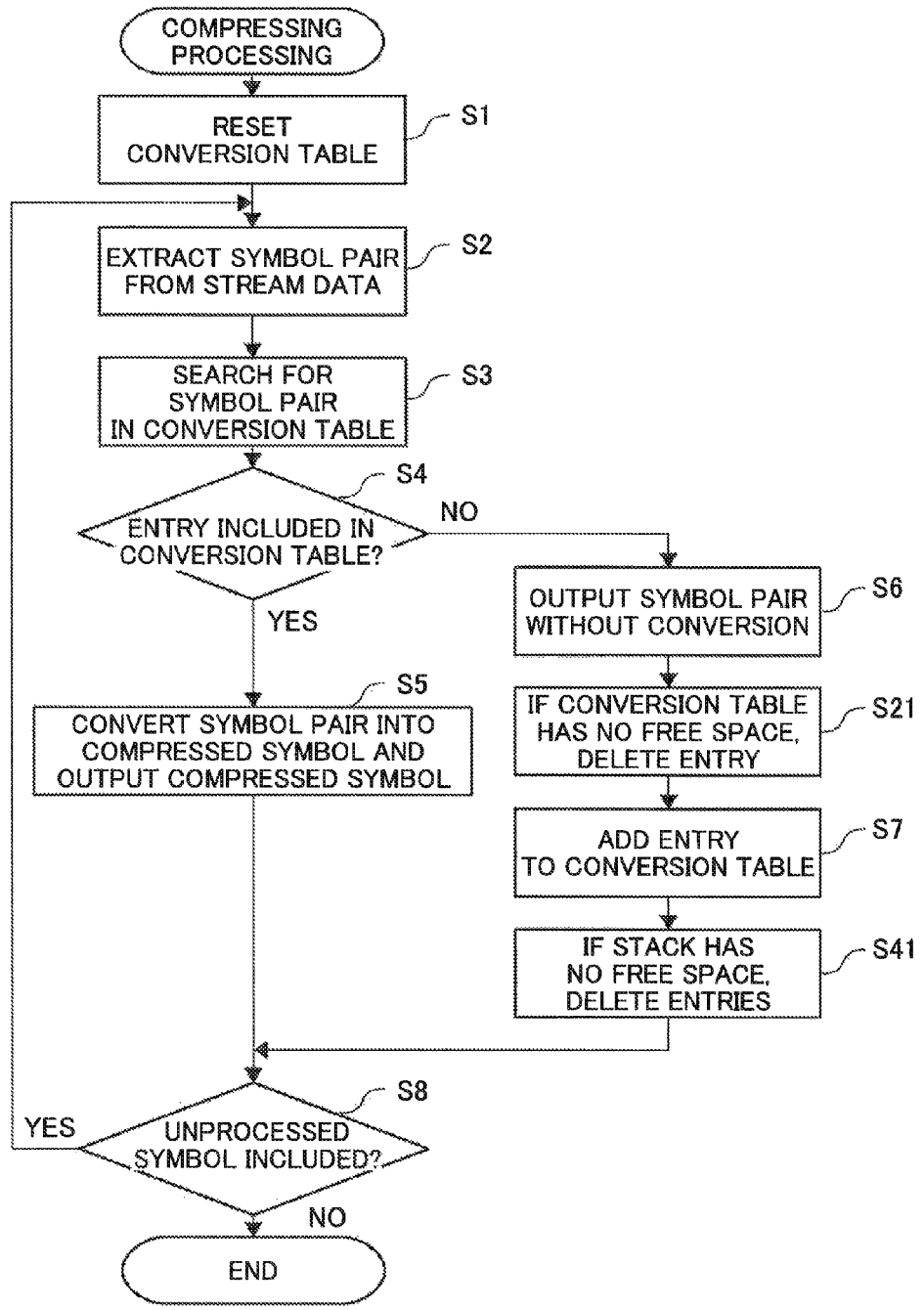
FIG. 14 is a processing flow diagram illustrating an example of compression processing according to Embodiment 3.

FIG. 14 is a processing flow diagram illustrating an example of compression processing according to the present embodiment. In the processing flow in FIG. 14, also, as in Embodiment 2, before processing for adding an entry to the conversion table 102 (S7), if the conversion table has no free space, processing for deleting an entry (S21) is performed. In the present step, an entry in the conversion table 102 is deleted and entries in the stack are also deleted. However, in the present step, recently-registered entries stored in the stack are targets of deletion. Also, in the processing flow in FIG. 14, in the processing for adding an entry to the conversion table (S7), an entry is added also to the stack. Then, if a capacity of the stack becomes too full, also, an entry is deleted from the conversion table and the stack is emptied (S41).

FIGS. 15A to 15D are diagrams for describing deletion of an entry from the conversion table 102. In the present embodiment, it is assumed that in a state in which stream data "AABBCCDDCCBBCCAA" is input and the entries illustrated in 15A are held in the conversion table 102, a symbol pair "EE" is input. Here, it is assumed that two symbol pairs are held in the stack and two symbol pairs "CCAA" are input before the symbol pair "EE" in the example in FIG. 15A. Although the capacity of the stack is preferably an arbitrary capacity that is equal to or below the number of entries in the conversion table, in the present embodiment, it is assumed that the capacity of the stack corresponds to two entries in the conversion table. In this case, in S21 in FIG. 14, the conversion table 102 has no free space, and thus, an entry is deleted. In other words, as illustrated in FIG. 15B, for the symbol pairs stored in the entries in the stack, reference frequencies in the relevant entries in the conversion table 102 are decremented by 1, and the entries are deleted from the stack. Then, as illustrated in FIG. 15C, an entry whose reference frequency becomes equal to or below a deletion threshold value as a result of the decrement of the reference frequency in the conversion table 102 is deleted. Also, as illustrated in FIG. 15D, an entry with the input symbol pair "EE" as a symbol string to be compressed is added to the conversion table 102 (FIG. 14: S7). Here, in the present step, an entry relating to the symbol pair "EE" is also added to the stack. Here, for the order of execution of the processing in S6 and the processing in S21, S7 and S41, the processing in S6 and the processing in S21, S7 and S41 may be performed in parallel or may be performed in reverse order.

As described above, with recently-registered entries stored in the stack set as targets of deletion, conversion rules can be changed according to a tendency of appearance of symbol pairs in stream data. Also, deletion and addition of entries in the conversion table 202 on the data decompressor 20 side based on rules that are similar to those of the data compressor 10 side enables the data decompressor 20 to properly decompress compressed stream data.

<Decompression Processing>

Figure 16:
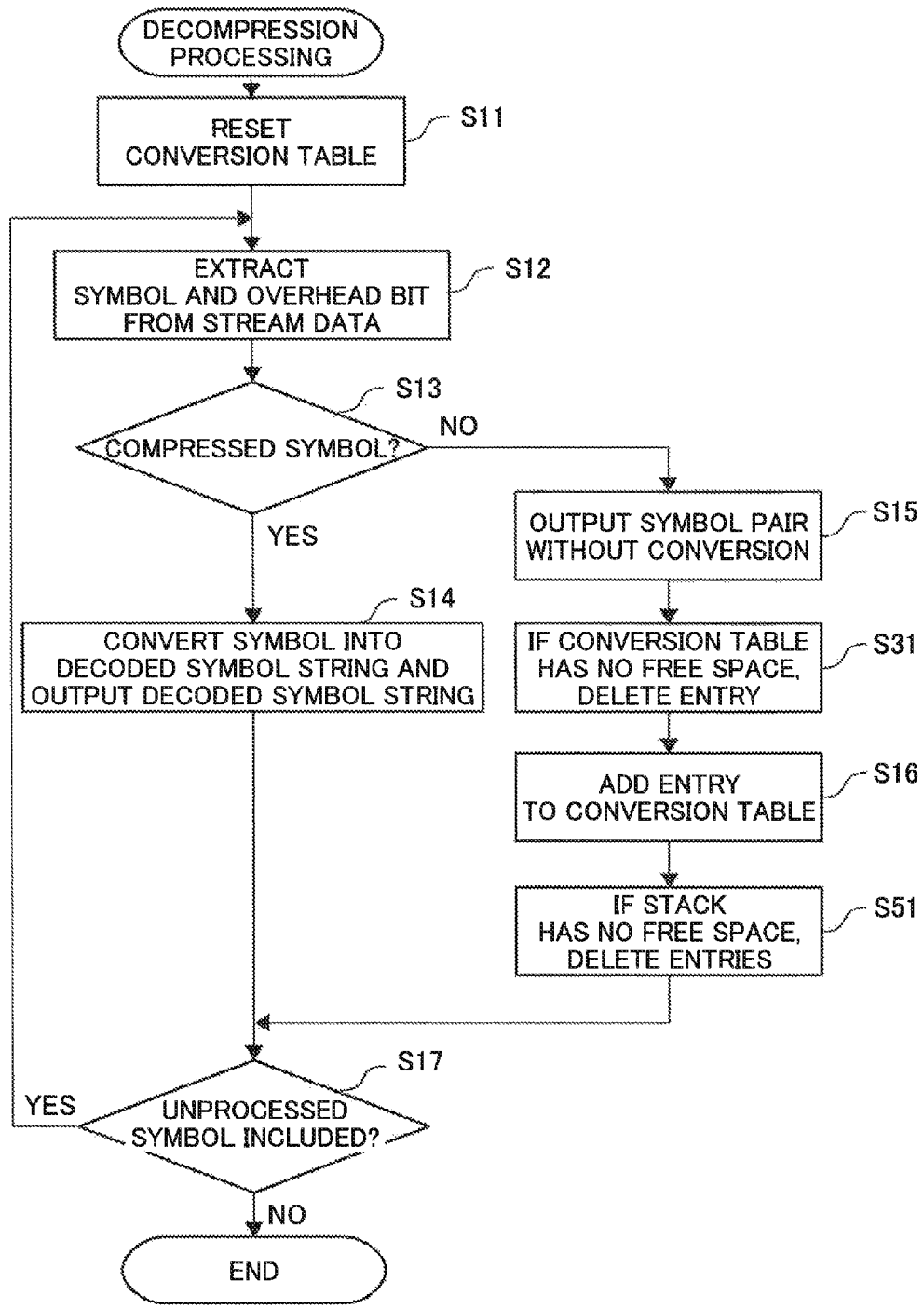
FIG. 16 is a processing flow diagram illustrating an example of decompression processing according to Embodiment 3.

FIG. 16 is a processing flow diagram illustrating an example of decompression processing according to the present embodiment. In the processing flow in FIG. 16, also, as in Embodiment 2, before processing for adding an entry to the conversion table 202 (S16), if the conversion table has no free space, processing for deleting an entry (S31) is performed. In the present step, an entry in the conversion table 102 is deleted and entries in a stack are also deleted. However, in the present step, recently-registered entries stored in the stack are targets of deletion. Also, in the processing flow in FIG. 16, in the processing for adding an entry to the conversion table (S16), an entry is added also to the stack. Then, if a capacity of the stack becomes too full, also, an entry is deleted from the conversion table, and the stack is emptied (S51).

FIGS. 17A to 17D are diagrams for describing deletion of an entry from the conversion table 202. In the present embodiment, it is assumed that in a state in which stream data "AABBCCDD210" is input and the entries indicated in FIG. 17A are held in the conversion table 102, a symbol pair "EE" is input. Here, two compressed symbols "1" and "0" are input before the symbol pair "EE", and two post-decoding symbol pairs are held in the stack. Here, it is assumed that the capacity of the stack in the data decompressor 20 is the same as that of the stack in the data compressor 10 and thus, corresponds to two entries in the conversion table. In this case, in S31 in FIG. 16, since the conversion table 202 has no free space, an entry is deleted. In other words, as illustrated in FIG. 17B, for the symbol pairs stored in the entries in the stack, reference frequencies of the relevant entries in the conversion table 102 are decremented by 1 and the entries are deleted from the stack. Then, as illustrated in FIG. 17C, an entry whose reference frequency becomes equal to or below the deletion threshold value as a result of the decrement of the reference frequency in the conversion table 202 is deleted. Subsequently, as illustrated in FIG. 17D, an entry with the input symbol pair "EE" as a symbol string to be compressed is added to the conversion table 202 (FIG. 16: S16). Here, in the present step, an entry relating to the symbol pair "EE" is also added to the stack.

As described above, with recently-registered entries stored in the stack set as targets of deletion, conversion rules can be changed according to a tendency of appearance of symbol pairs in stream data. Also, entries in the conversion table 102 in the data compressor 10 and entries in the conversion table 202 in the data decompressor 20 are deleted and added at timings synchronized with each other. Therefore, even if conversion rules for symbols are changed, the data decompressor 20 can properly decompress post-compression stream data.

Embodiment 4

In the present embodiment, also, entries are deleted from a conversion table 102 in a data compressor 10 and a conversion table 202 in a data decompressor 20. Also, in the present embodiment, also, components that are in common to those of the above-described embodiments are provided with reference numerals that are the same as those of the above-described embodiments and description thereof will be omitted, and description will be described mainly on differences. In the present embodiment, also, when an entry is added, if there is no free space, an entry is deleted from a conversion table. More specifically, an entry holding a symbol pair whose frequency of appearance in stream data is low as a symbol string to be compressed is deleted. However, in the present embodiment, all entries are not sequentially searched, but the respective entries are subjected to processing in parallel.

<Data Compressor>

Figure 18:
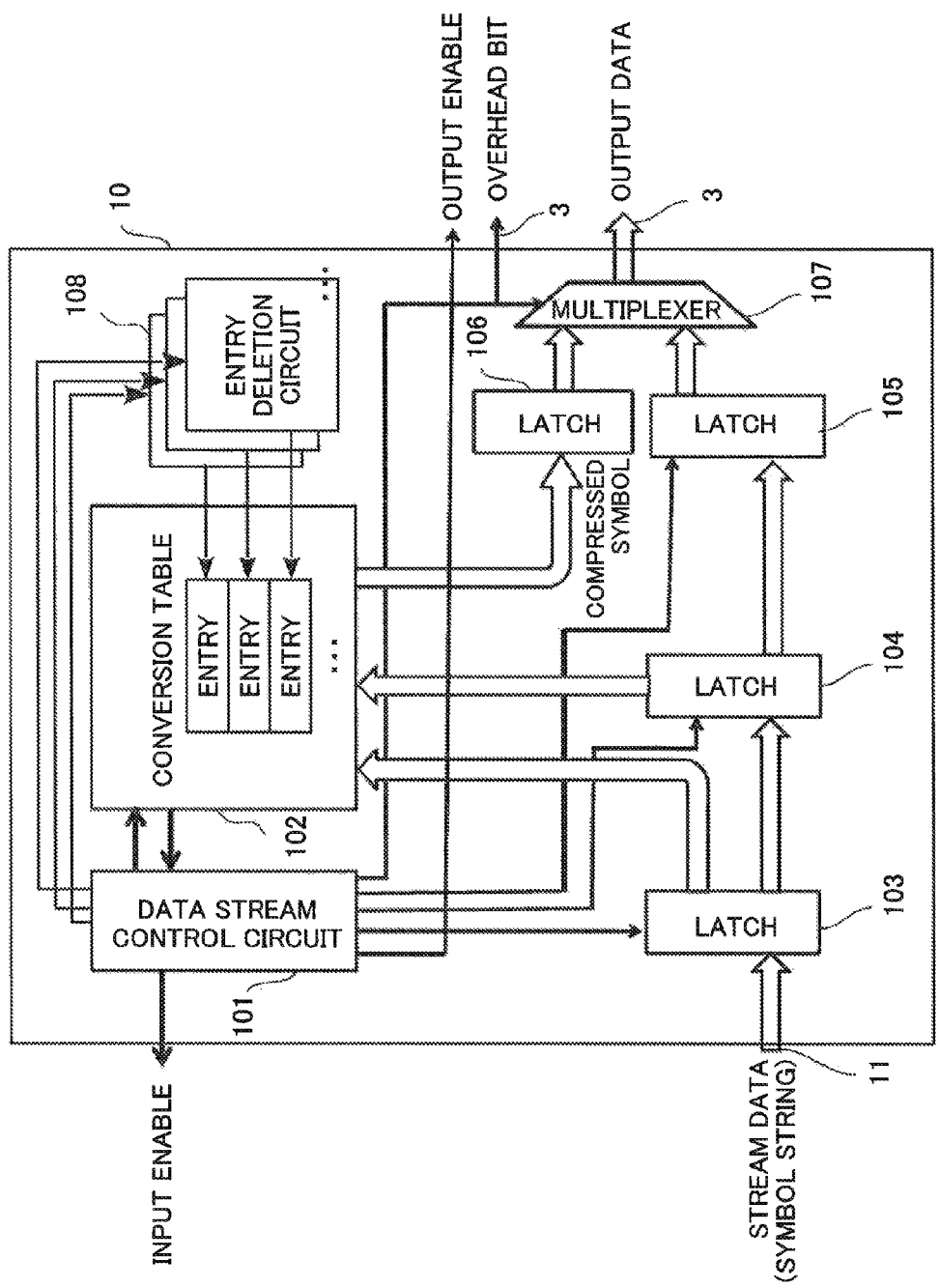
FIG. 18 is a functional block diagram illustrating an example of a data compressor according to Embodiment 4.

FIG. 18 is a block diagram illustrating an example of the data compressor 10 according to Embodiment 4. The data compressor 10 in FIG. 18 includes, for example, a number of entry deletion circuits 108, the number corresponding to the number of entries that can be registered in a conversion table. The entry deletion circuits 108 each receive an instruction from the data stream control circuit 101 and perform processing for decrementing respective values of reference frequencies in the conversion table and deletion of an entry whose value of the reference frequency becomes equal to or below a deletion threshold value, in parallel. The provision of the plurality of entry deletion circuits increases the circuit size, but enables reduction in time necessary for entry deletion. Such entry deletion circuits can be each formed by, e.g., an LSI or an FPGA.

<Compression Processing>

In the present embodiment, a timing for entry deletion is similar to, for example, that of Embodiment 2 described above. In other words, the data compressor 10 operates according to the processing flow illustrated in FIG. 10. However, processing for decrementing a reference frequency illustrated in FIG. 11B is executed in parallel.

<Data Decompressor>

Figure 19:
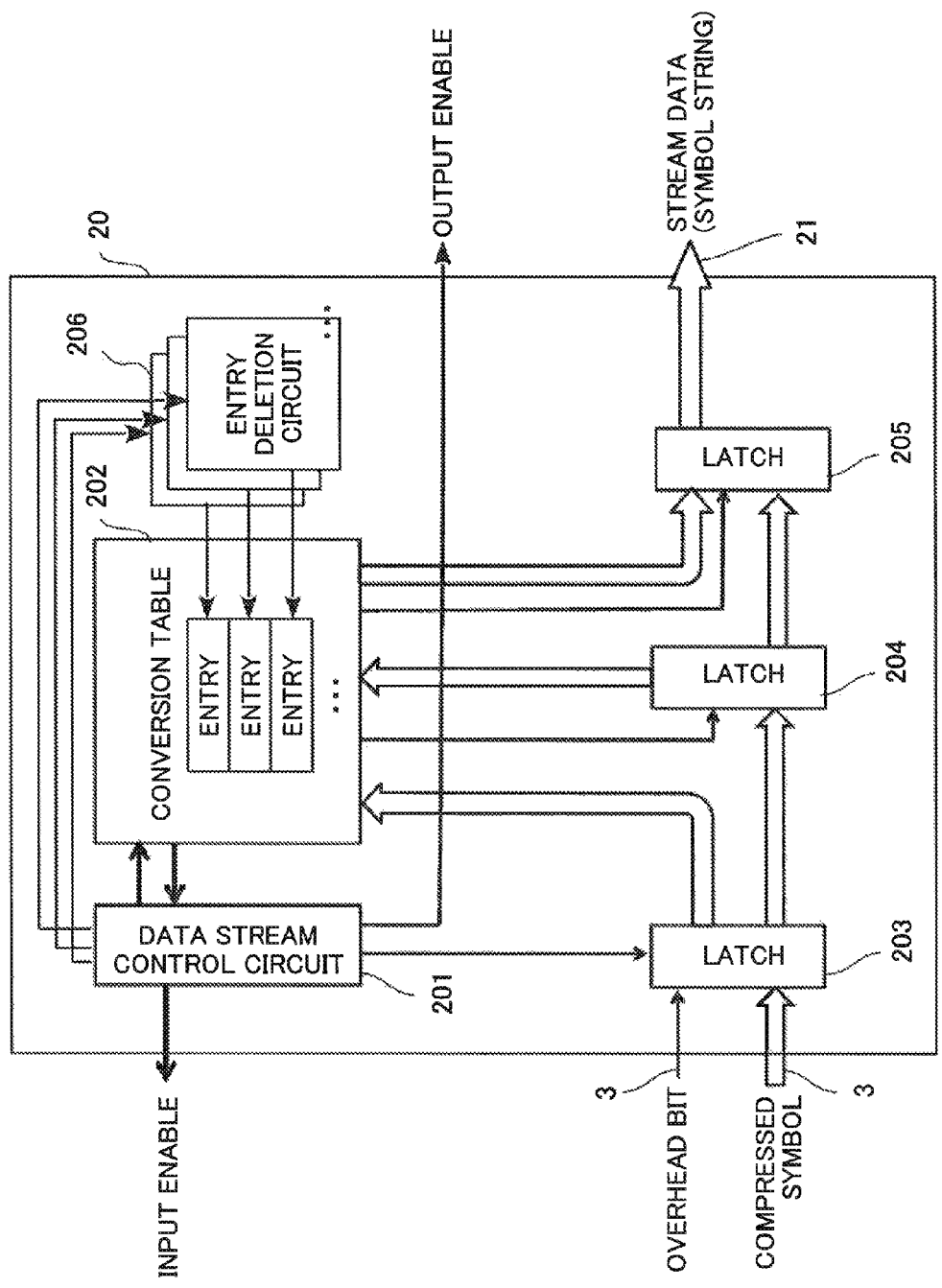
FIG. 19 is a functional block diagram illustrating an example of a data decompressor according to Embodiment 4.

FIG. 19 is a block diagram illustrating an example of the data decompressor 20 according to Embodiment 4. The data decompressor 20 in FIG. 19 also include a plurality of (for example, a number corresponding to a number of entries that can be registered in a conversion table) entry deletion circuits 206. The plurality of entry deletion circuits 206 each receive an instruction from a data stream control circuit 201 and performs processing for decrementing respective values of reference frequencies in the conversion table and deleting an entry whose value of the reference frequency becomes equal to or below a deletion threshold value, in parallel. The provision of the plurality of entry deletion circuits 206 in the data decompressor 20 increases the circuit size, but enables reduction in time necessary for entry deletion. The entry deletion circuits in the data decompressor 20 can also be each formed by, e.g., an LSI or an FPGA.

<Decompression Processing>

In the present embodiment, also, a timing for entry deletion is similar to, for example, that of Embodiment 2 described above. In other words, the data decompressor 20 operates according to the processing flow illustrated in FIG. 12. However, the reference frequency decrement processing indicated in FIG. 13B is executed in parallel.

Embodiment 5

In the present embodiment, also, entries are deleted from a conversion table 102 in a data compressor 10 and a conversion table 202 in a data decompressor 20. Also, in the present embodiment, also, components that are in common to those of the above-described embodiments are provided with reference numerals that are the same as those of the above-described embodiments and description thereof will be omitted, and description will be described mainly on differences. In the present embodiment, it is assumed that a data stream control circuit performs deletion of an entry from a conversion table and addition of an entry to the conversion table in parallel, rather than sequentially searching all entries for the first time when a conversion table has no free space. In other words, in S7 in the compression processing in FIG. 4 or S16 in the decompression processing in FIG. 8, deletion of an entry from the conversion table is also performed.

Also, the data stream control circuit 101 and the data stream control circuit 201 each include information indicating a position of registration of an entry in the relevant conversion table (also referred to as "registration index") and information indicating a position of deletion of an entry in the relevant conversion table (also referred to as "deletion index"). The registration index and the deletion index each move around positions on the conversion table based on a predetermined rule. For example, the registration index may sequentially search for free space in the conversion table from a top of the conversion table each time and determine the free space or may search for free space appearing next from a position at which an entry was added last time. Then, an entry is added to the found free space. Also, the deletion index moves around positions of insertion of entries one by one each time the conversion table is referred to. Then, when an entry is inserted at a position of the deletion index in the conversion table, if a reference frequency of the entry is equal to or below a deletion threshold value, the entry is deleted. On the other hand, if the reference frequency is not equal to or below the deletion threshold value, the reference frequency of the entry is decremented by 1.

<Creation and Update of Conversion Table>

FIGS. 20A to 20I are diagrams for describing addition and deletion of entries in a conversion table. Here, it is assumed that stream data "AABBCCDDCCBBCCAADDEE" is input. Also, it is assumed that the registration index searches for free space appearing first from the top of the conversion table. Then, it is assumed that the deletion index moves around the entry registration positions sequentially from the top of the conversion table.

As illustrated in FIG. 20A, in an initial state, the registration index and the deletion index indicate the top entry registration position. In this case, as illustrated in FIG. 20B, an input symbol pair "AA" is registered in a first of the conversion table. Also, the registration index indicates a second field, which is a first free space where the conversion table is searched from the top. Also, the deletion index moves to a next entry registration position and indicates a second field of the conversion table.

Figure 20D:
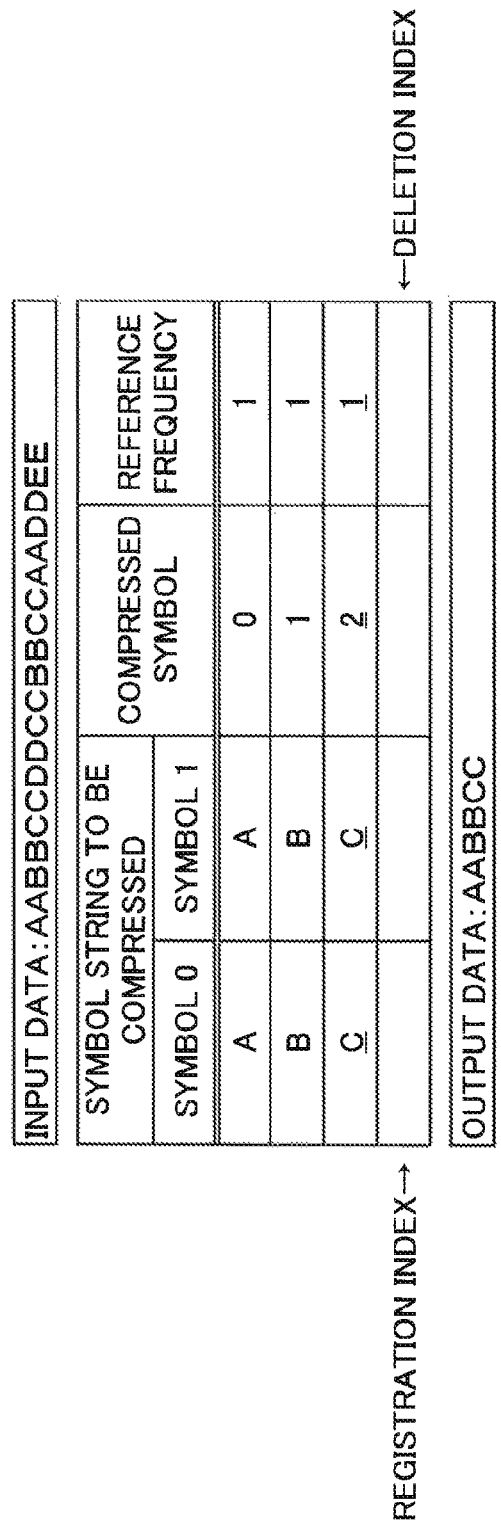
FIG. 20D is a diagram for describing registration and update of entries in a conversion table according to Embodiment 5.

Then, upon a next symbol pair "BB" being input, as illustrated in FIG. 20C, a symbol string to be compressed "BB" is registered in the second field indicated by the registration index and output as it is. Also, the registration index indicates a third field, which is a first free space where the conversion table is searched from the top. The deletion index moves a next entry registration position and indicates the third field of the conversion table. Likewise, upon a next symbol pair "CC" being input, as illustrated in FIG. 20D, a symbol string to be compressed "CC" is registered in the third field indicated by the registration index and output as it is. Subsequently, the registration index indicates a fourth field, which is a first free space where the conversion table is searched from the top. The deletion index moves to a next entry registration position and indicates the fourth field of the conversion table.

Figure 20E:
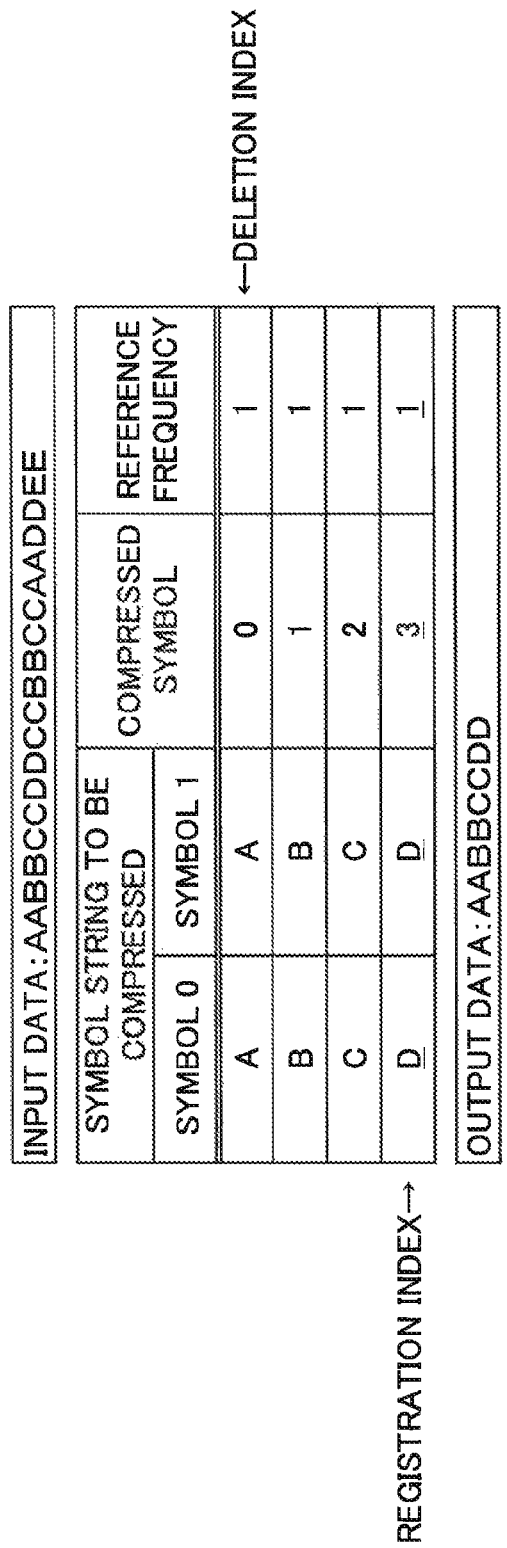
FIG. 20E is a diagram for describing registration and update of entries in a conversion table according to Embodiment 5.

Then, upon a next symbol pair "DD" being input, as illustrated in FIG. 20E, a symbol string to be compressed "DD" is registered in the fourth field indicated by the registration index and output as it is. Also, the registration index does not move because the conversion table has no free space. On the other hand, the deletion index moves a next entry registration position and indicates the first field of the conversion table. At this time, a reference frequency of the entry registered in the first is 1 and thus is determined as being equal to or below the deletion threshold value, and as illustrated in FIG. 20F, the entry is deleted. Then, the registration index moves to the first field, which is a first free space where the conversion table is searched from the top.

Then, upon a next symbol pair "CC" being input, as illustrated in FIG. 20G, a reference frequency of a third entry in which a symbol pair to be compressed is "CC" is incremented by 1, and a compressed symbol "2" is output. Also, the registration index already indicates the first field, which is a first free space where the conversion table is searched from the top and thus does not move. On the other hand, the deletion index moves to a next entry registration position and indicates the second field of the conversion table. At this time, a reference frequency of the entry registered in the second is 1 and is thus determined as being equal to or below the deletion threshold value and the entry is deleted.

Figure 20H:
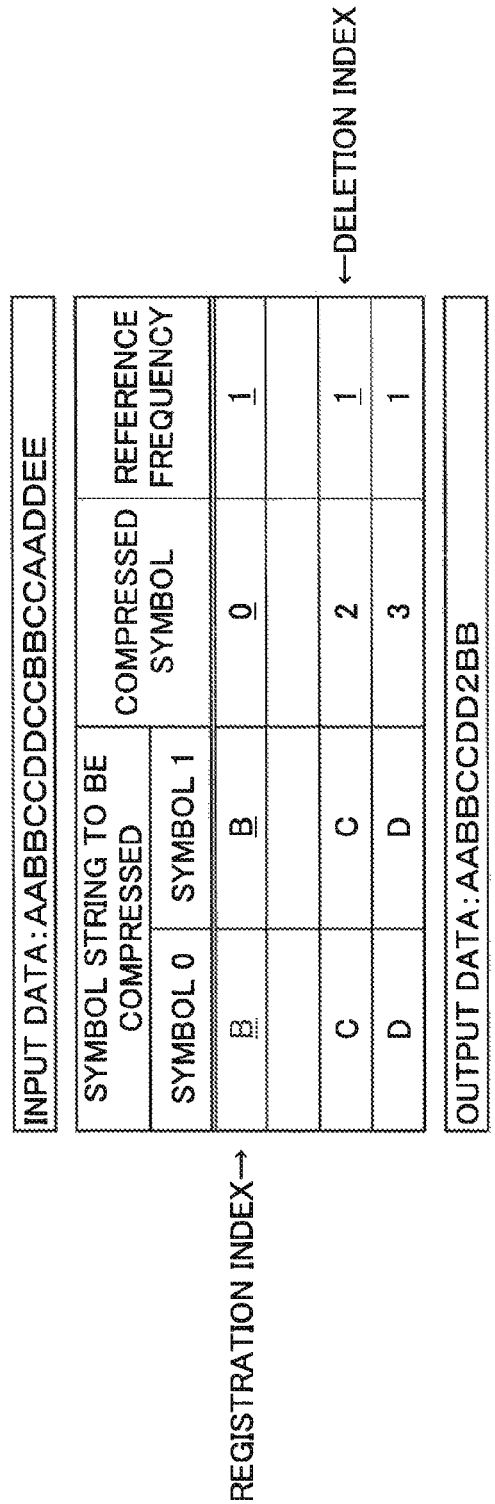
FIG. 20H is a diagram for describing registration and update of entries in a conversion table according to Embodiment 5.

Also, upon a next symbol pair "BB" being input, as illustrated in FIG. 20H, a symbol string to be compressed "BB" is registered in the first field indicated by the registration index and output as it is. On the other hand, the deletion index moves to a next entry registration position and indicates the third field of the conversion table. At this time, a reference frequency of the entry registered in the third is 2, which is larger than the deletion threshold value, and the entry is thus not deleted, but in the present step, the reference frequency is decremented by 1 and becomes "1".

Figure 20I:
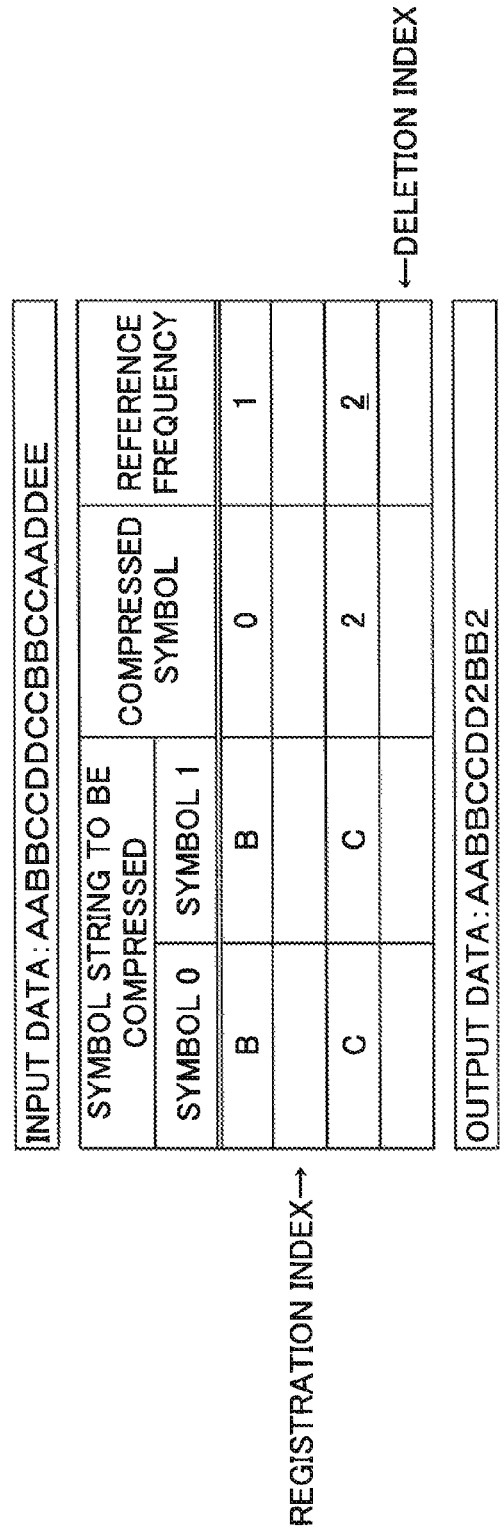
FIG. 20I is a diagram for describing registration and update of entries in a conversion table according to Embodiment 5.

Then, upon a next symbol pair "CC" being input, as illustrated in FIG. 20I, the reference frequency of the third entry in which the symbol pair to be compressed is "CC" is incremented by 1, and a compressed symbol "2" is output. Also, the registration index already indicates the second field, which is a first free space where the conversion table is searched from the top and thus does not move. On the other hand, the deletion index moves to a next entry registration position and indicates the fourth field of the conversion table. At this time, a reference frequency of the entry registered in the fourth is 1 and is thus determined as being equal to or below the deletion threshold value, and the entry is deleted.

As described above, in the present embodiment, registration and deletion are performed in parallel. Also, corresponding processing is performed in the data decompressor 20. Consequently, an amount of processing for deletion can be reduced and thus processing is completed within a preferable period of time and an increase in circuit size can be suppressed.

Also, the registration index may indicate not a free space appearing first from the top from the conversion table, but a site of an entry deleted last. For example, in FIG. 20F, it is assumed that if the entry in the first row is deleted, the registration index indicates a position of the first row until another entry is deleted next time. Consequently, hardware for searching for a free entry in the table can be reduced and the number of clocks necessary for registration processing can be reduced.

Also, while moving around the entry registration positions sequentially from the top of the conversion table, the deletion index may be prevented from deleting an entry even though a reference frequency of the entry is 1 if the conversion table has free space. For example, until subsequent registration is performed at a position of the entry deleted in FIG. 20F, the deletion index continues moving around, but no entry is deleted. Therefore, in FIG. 20G, the entry in the second row is not deleted. Accordingly, as many as possible of entries can be held in the conversion table, and thus, in compression processing and decompression processing, a rate of hits for a symbol pair in the conversion table is enhanced.

Embodiment 6

A data compression apparatus and a data decompression apparatus including a plurality of the above-described data compressors 10 connected in series and a plurality of the above-described data decompressors 20 connected in series, respectively, to enhance a data compression rate are indicated. Since Embodiment 6 also includes components that are in common to Embodiments 1 to 5, the common components are provided with reference numerals that are the same as those of Embodiments 1 to 5 and description thereof will be omitted, and description will be provided mainly on differences.

FIG. 21 illustrates an example of a data compression apparatus including data compressors 10 connected at multiple stages. The data compression apparatus illustrated in FIG. 21 includes four data compressors 10 connected in series. However, the number of data compressors included in the data compression apparatus can arbitrarily be selected. Here, the plurality of data compressors 10 included in the data compression apparatus are referred to as a first stage, a second stage, a third stage and a fourth stage in order of closeness to a transmission-side apparatus 1 (not illustrated) (that is, in order of farness from a transmission path 3).

The first-stage data compressor 10 outputs a symbol string including compressed symbols obtained as a result of compression processing, and an overhead bit string in which flags (overhead bits) corresponding to respective symbols included in the symbol string are aligned in an order agreeing with an order of the symbols included in the symbol string.

The second-stage data compressor 10 outputs a symbol string obtained by 9-bit compression processing of the symbol string and the overhead bits from the first stage, and an overhead bit string formed by a flag group corresponding to the symbol string. Likewise, the third-stage data compressor 10 outputs a symbol string obtained by 10-bit compression processing of the symbol string and the overhead bits from the second stage, and a bit string formed by a flag group corresponding to the symbol string. Likewise, the fourth-stage data compressor 10 outputs a symbol string obtained by 11-bit compression processing of the symbol string and the overhead bits from the third stage, and a bit string formed by a flag group corresponding to the symbol string. Then, the output of the fourth-stage data compressor 10 is transmitted to the data decompressor 20 via the transmission path 3.

FIG. 22 illustrates an example of a data decompression apparatus in which data decompressors 20 are connected at multiple stages. The data decompression apparatus illustrated in FIG. 22 includes four data decompressors 20 connected in series. However, the number of data decompressors included in the data decompression apparatus only needs to be equal to or exceed the number of data compressors included in the data compression apparatus. Here, the plurality of data decompressors 20 included in the data decompression apparatus are referred to as a first stage, a second stage, a third stage and a fourth stage in order of closeness to a reception-side apparatus 2 (not illustrated) (in order of farness from the transmission path 3).

A symbol string including compressed symbols obtained as a result of four-stage compression processing in the data compression apparatus and an overhead bit string in which flags (overhead bits) indicating whether or not symbols are compressed at the respective stages are aligned in an order agreeing with that of the symbols included in the symbol string are input to the fourth-stage data decompressor 20. The fourth-stage data decompressor 20 performs decompression processing in units of 11-bit symbols based on overhead bits output by the fourth-stage data compressor 10 in the data compression apparatus.

Likewise, a symbol string obtained as a result of the decompression processing in the fourth-stage data decompressor 20 and a bit string in which flags (overhead bits) indicating whether or not symbols are compressed at the third stage in the data compression apparatus are aligned in an order agreeing with that of the symbols included in the symbol string are input to the third-stage data decompressor 20. In other words, the third-stage data decompressor 20 performs decompression processing in units of 10-bit symbols based on overhead bits output by the third-stage data compressor 10 in the data compression apparatus.

Also, a symbol string obtained as a result of the decompression processing in the third-stage data decompressor 20 and a bit string in which flags (overhead bits) indicating whether or not symbols are compressed at the second stage in the data compression apparatus are aligned in an order agreeing with that of the symbols included in the symbol string are input to the second-stage data decompressor 20. In other words, the second-stage data decompressor 20 performs decompression processing in units of 9-bit symbols based on overhead bits output by the second-stage data compressor 10 in the data compression apparatus.

Then, a symbol string obtained as a result of the decompression processing in the second-stage data decompressor 20 and a bit string in which flags (overhead bits) indicating whether or not symbols are compressed at the first stage in the data compression apparatus are aligned in an order agreeing with that of the symbols included in the symbol string are input to the first-stage data decompressor 20. In other words, the first-stage data decompressor 20 performs decompression processing in units of 8-bit symbols based on the input overhead bits.

Consequently, stream data before compression by the data compressor 10 is restored and output to the reception-side apparatus 2. Also, redundant employment of compression processing according to the present embodiment enables enhancement in compression rate.

Also, in the present embodiment, if decompression processing at a number of stages that is equal to or exceeds a number of stages of compression processing performed in the data compression apparatus can be performed, compressed data can be decompressed even if the respective numbers of stages are different from each other. In other words, even if the number of stages on the compression side is smaller than the number of stages on the decoding side, data decompressors 20 at a number of stages corresponding to the number of stages on the compression side based on a data width of symbols perform decompression processing. Depending on the content of stream data, compression rate improvement may reach a limit even if the number of data compressors 10 is increased to provide stages that are equal to or exceed a certain number of stages, and thus, a compression stage count control unit 12, which is illustrated in FIG. 21, may be added so as to be able to change the number of stages of compression processing. For example, in the data compressor 10 of each stage, a rate of conversion of symbols or a compression rate is calculated, and if a rate of conversion of symbols or a compression rate is below a predetermined threshold value, the compression stage count control unit 12 performs control so as not to perform compression processing at a stage subsequent to the relevant stage. Here, such processing may be determined independently by a data compressor 10 of each stage. As described above, even if the number of stages of compression processing performed in the data compression apparatus, a corresponding number of stages of decompression processing can be performed by the configuration of the data decompression apparatus illustrated in FIG. 22.

Embodiment 7

The techniques indicated in the above-described embodiments can be applied to various transmission paths. For example, the transmission path 3 may be a wired path such as an optical cable or an HDMI (High-Definition Multimedia Interface, registered trademark) or an USB (Universal Serial Bus) or a wireless path such as Bluetooth (registered trademark). Also, the transmission-side apparatus 1, the data compressor 10, the data decompressor 20 and the reception-side apparatus 2 may be synchronized to reset entries in the conversion table 102 and the conversion table 202 and start positions of the registration index and the deletion index indicated in Embodiment 5 to respective states determined in advance. Such instruction may be transmitted via direct signal wires, and, for example, if a data compressor transmits compressed data in packets based on a formant determined in advance, for example, a flag for providing an instruction for resetting may be included in a header. Also, data to be compressed is not limited to stream data, and may be, for example, a data string transmitted/received via, e.g., a USB.

Figure 23:
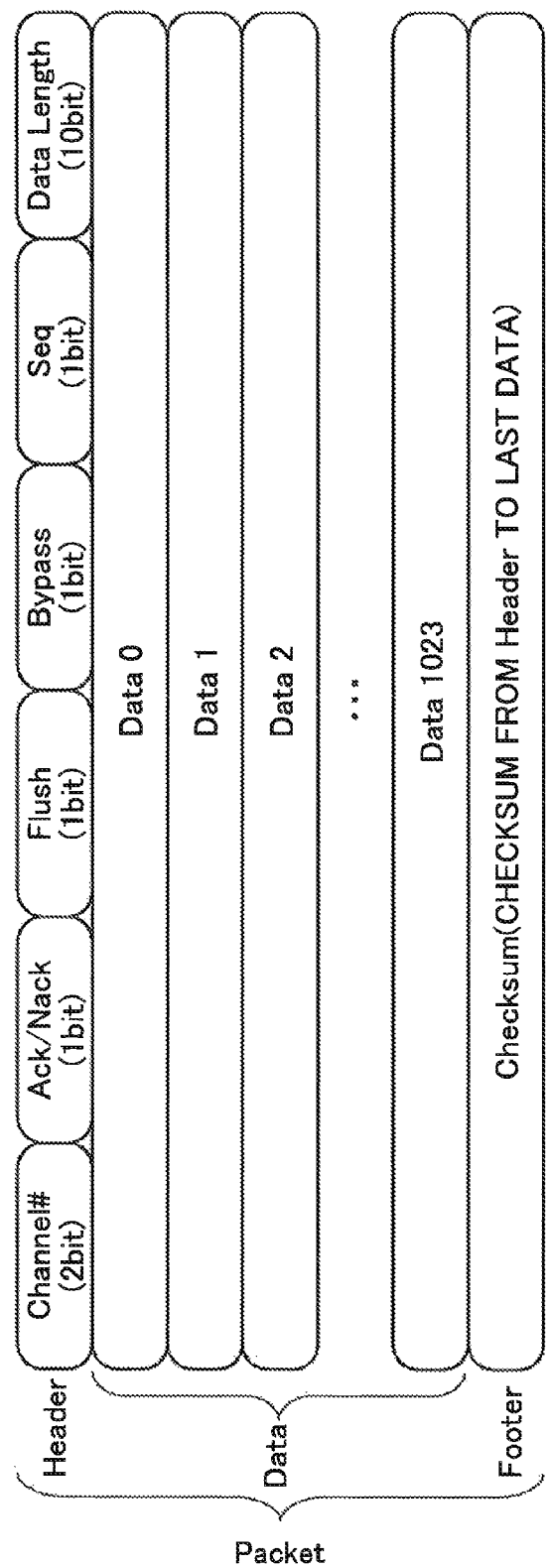
FIG. 23 is a diagram illustrating an example of a data format according to Embodiment 7.

FIG. 23 is a diagram illustrating an example of a format where compressed data is transmitted in packets according to a unique protocol. The example packet illustrated in FIG. 23 is one for a transmission path 3 having a 16-bit width and 4 channels, a maximum data length of which is 1023 symbols. A header includes fields of "Channel#" (2 bits) for determining which of the multiple transmission paths to use, "Ack/Nack" (1 bit) for providing a response as to whether or not reception succeeds, "Flush" (1 bit) for providing an instruction for resetting of, e.g., a conversion table, "Bypass" (1 bit) for providing an instruction for a bypass that prevents execution of decoding of symbols and let the symbols through as they are, and "Data Length" (10 bits) indicating a length of a "Data" section. Also, each field of the "Data" section can store one symbol, and a maximum of 1023 symbols can be stored. Consequently, boundaries between symbols are clear. Furthermore, a footer includes a field of "Checksum" for detection and correction of an error in transmission data. Such format is employed and the compressed data is packetized, for example, subsequent to the final-stage data compressor 10. Also, if the "Flush" section of the header indicates 1, e.g., entries in a conversion table are reset. In this case, if "Flush" indicates 1 and "Data length" indicates 0, the conversion table is reset to a predetermined value, and if "Flush" indicates 1 and "Data length" does not indicate 0, an initial value of the conversion table may be transmitted using the "Data" section. If "Flush" indicates 1 and "Data length" does not indicate 0, for example, a symbol pair is stored in each field of the "Data" section and transmitted, and on the reception side, the symbol pairs are registered in entries in the conversion table in an order of storage of the symbol pairs in the "Data" section. Also, a preamble signal using, e.g., Manchester coding is transmitted before packet transmission, for synchronization with the reception side.

Figure 24:
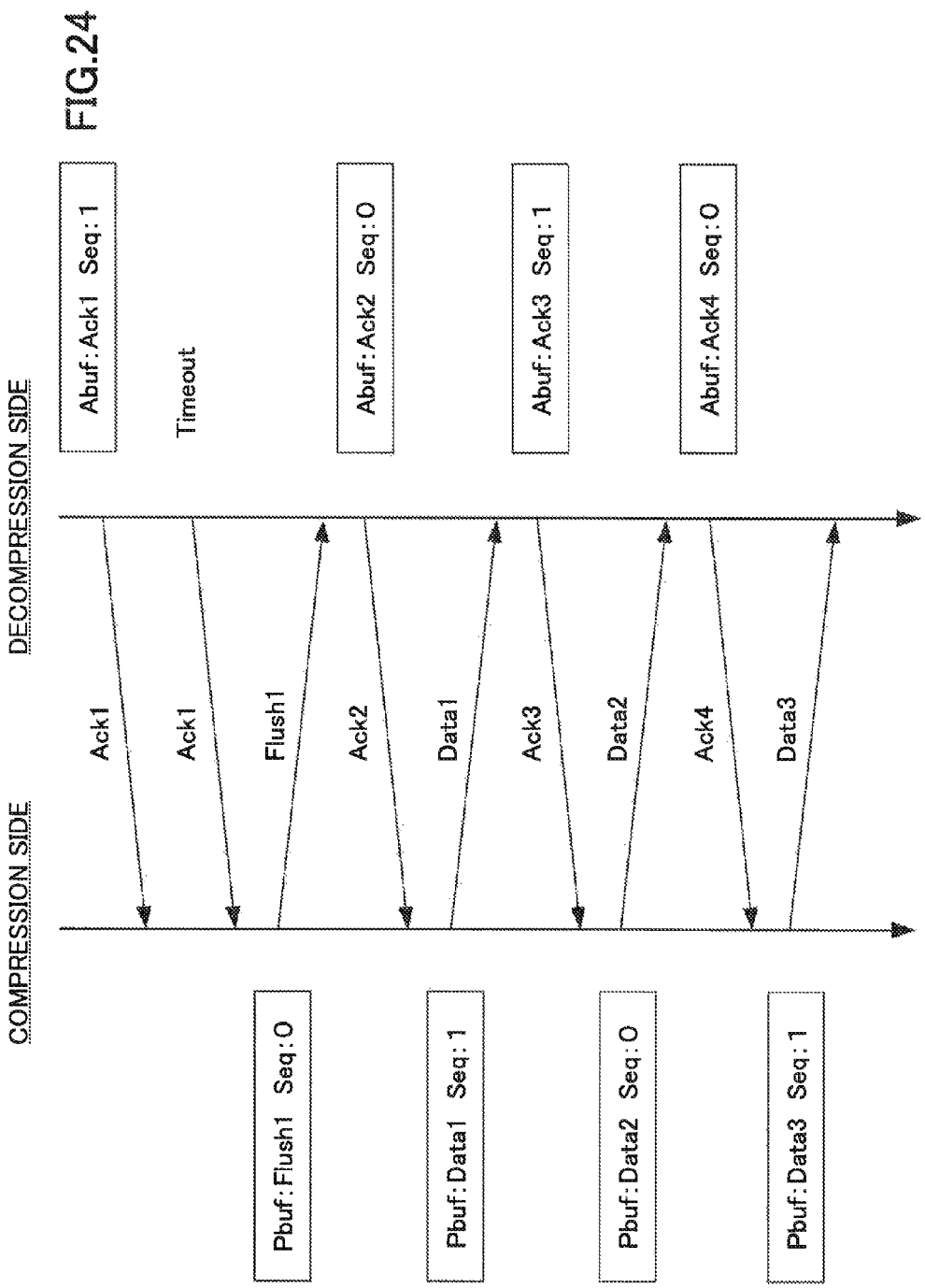
FIG. 24 is a sequence diagram illustrating an example of communication according to Embodiment 7.

FIG. 24 is a sequence diagram illustrating an example of communication according to the present embodiment. Information pieces surrounded by rectangles indicate respective states on the compression side and the decompression side, and are stored in respective predetermined storage areas at the respective stages. Each of the storage areas is provided for each of the aforementioned number of channels. On the compression side, a buffer "Pbuf" of a packet size, which is used for packet retransmission, and a "Seq" register used for control of the relevant protocol are provided. Also, on the decompression side, "Abuf" for holding the content of recent transmission (Ack or Nack of last time), a "Seq" register used for control of the relevant protocol, and a counter for a timeout are provided. Also, in an initial state, Ack is set in Abuf, and Seq on the compression side indicates 0 and the Seq on the compression side indicates 1. Here, Seq is switched (toggled) between 0 and 1 at the time of transmission, and is not switched at the time of retransmission.

More specifically, after transmission of Ack1 with no error from the decompression side, if there is no transmission from the compression side, a timeout is transmitted from the decoding side. Subsequently, when new communication is started from the compression side, Flush1 is transmitted to reset, e.g., entries in the conversion table. On the other hand, upon reception with no problem on the decompression side, Ack2 is transmitted. Subsequently, if communication is established with no error, transmission of compressed data from the compression side is started, and Data1, Data2, Data3, . . . are transmitted.

Figure 25:
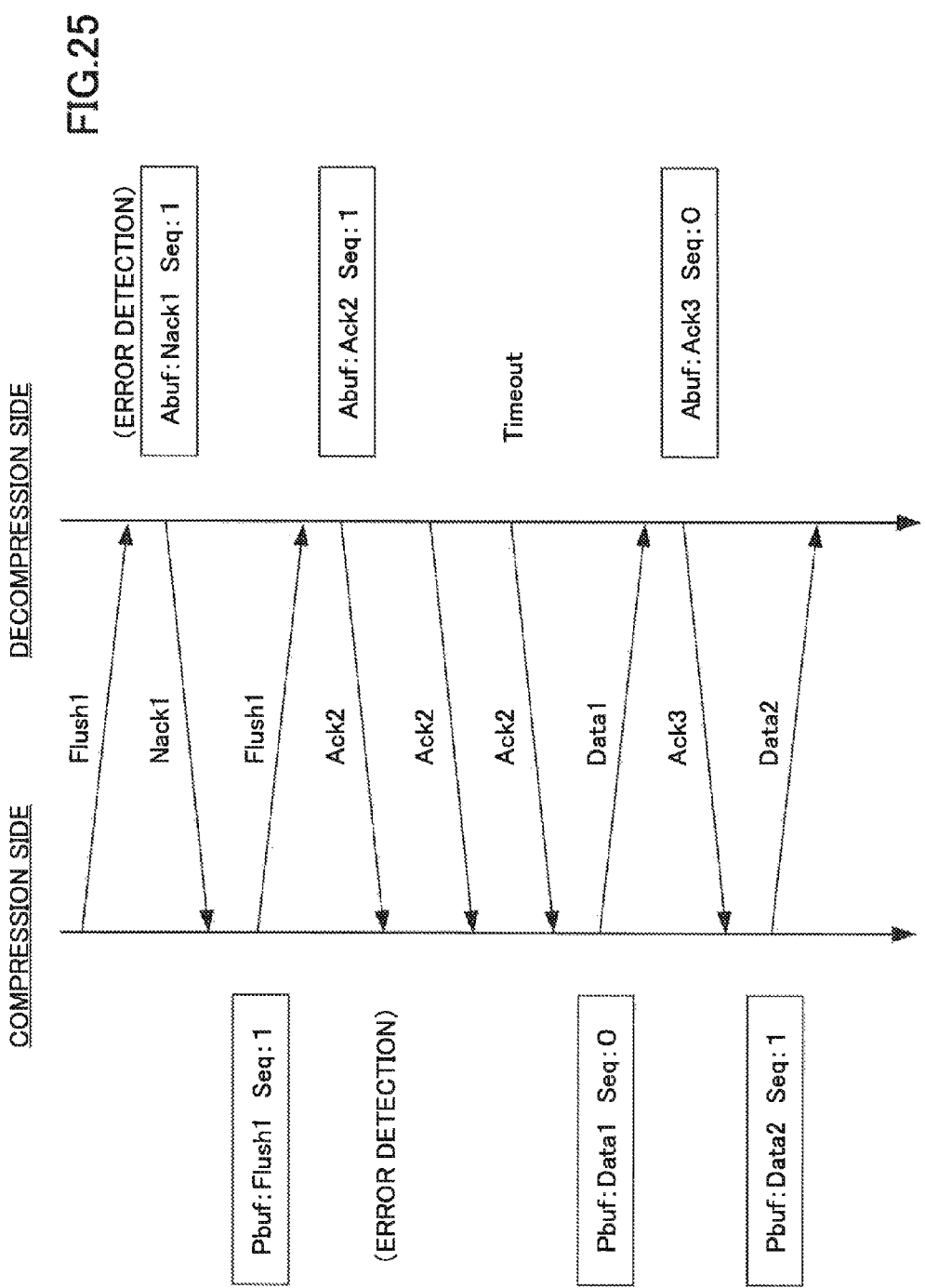
FIG. 25 is a sequence diagram illustrating an example of communication according to Embodiment 7.

FIG. 25 is a sequence diagram illustrating another example of communication according to the present embodiment. As illustrated in FIG. 25, on the decompression side, after transmission of Ack/Nack, the timer is started for determination of a timeout. On the other hand, if an error is detected on the compression side, no specific response is made and a timeout on the decompression side is waited for. Transmission of Ack after a timeout on the decompression side enables continuation of transmission from the compression side.

More specifically, it is assumed that Flush1 is transmitted from the compression side and, e.g., a checksum error occurs on the decompression side. In this case, Nack1 is transmitted from the decompression side, and on the decompression side, the timer is started. On the other hand, upon reception of Nack1, the compression side retransmits Flush1. Then, if Flush1 is received on the decompression side before a timeout, Ack2 is transmitted, and the timer is started. On the other hand, if, e.g., a checksum error is detected at the time of reception of Ack2 on the compression side, the compression side makes no response. Subsequently, upon occurrence of a timeout on the decompression side, Ack2 is retransmitted and the timer is started. Also, if there is no data transmitted from the compression side, a timeout is repeated, and Ack2 is retransmitted. On the other hand, upon start of transmission of compressed data on the compression side, Data1 is transmitted. Also, if Data1 is received with no problem on the decompression side, Ack3 is transmitted.

As described above, use of a timeout on the decompression side enables communication to be properly continued even if an error occurs.

Embodiment 8

The above-described compression processing and decompression processing not only reduce an amount of data transmitted, but have an aspect of encrypting the content of data to be transferred by means of what is called substitution cipher. In other words, compressed data cannot be decoded unless entries in an initial conversion table, an initial value of a registration index and an initial value of a deletion index are known. Here, the compression processing and decompression processing according to the above-described embodiments has a characteristic of, upon appearance of a symbol pair not registered in the conversion table, the data compressor 10 outputting the symbol pair without conversion. Consequently, a corresponding entry can be registered also in the conversion table created by the data decompressor 20, but the relevant code may be broken by a third party intercepting the symbol pair transmitted without conversion. Therefore, in the present embodiment, at least a part of a symbol pair output without conversion is scrambled for enhancement in encrypting strength.

Figure 26:
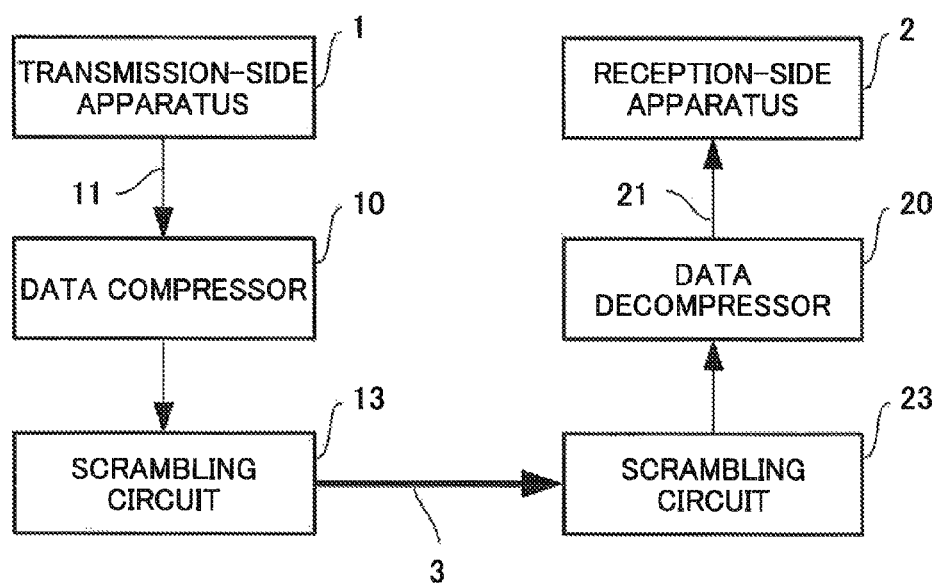
FIG. 26 is a diagram illustrating an example of a data compression/decompression system including a scrambling circuit.

FIG. 26 is a diagram illustrating an example of a data compression/decompression system (data encrypting/decoding system) including a scrambling circuit. The data compression/decompression system according to the present embodiment includes a scrambling circuit 13 that scrambles an output of the data compressor 10 before the output is sent out to a transmission path 3. The data compression/decompression system according to the present embodiment also includes a scrambling circuit 23 that scrambles compressed data received via the transmission path 3 before a data decompressor 20 performs decompression processing.

In such data compression/decompression system, the scrambling circuit 13 and the scrambling circuit 23 scramble data flowing on the transmission path 3 according to a predetermined encrypting method. The encrypting method is not specifically limited, but, for example, the following method can be employed. Here, in the present embodiment, it is assumed that a symbol has 8 bits.

First, it is assumed that the data compressor 10 and the data decompressor 20 each hold a data set in an initial state of a relevant conversion table (entry in an initial conversion table, an initial value of a registration index and an initial value of a deletion index: a common key). Then, the data compressor 10 and the data decompressor 20 each obtain, for example, an MD5 checksum A based on the data set in the initial state of the conversion table. Also, it is assumed that the scrambling circuit 13 and the scrambling circuit 23 each hold a password (common key) determined in advance. Then, for example, an MD5 checksum B is obtained based on the password. Then, with an index of a compressed symbol as "i", X(i) below is calculated.

$$X(i)=A[i+7:i]\% B$$

Here, it is assumed that the above expression indicates a case where the symbol has 8 bits and the index i counts from 1. According to MD5, a checksum of 32 hexadecimal numerals is obtained, A[i+7:i] is used so as to move around the bits of the checksum. Then, upon X(i) and the compressed symbol S(i) being XORed according to the below expression, a value S'(i) resulting from scrambling can be obtained, and S'(i) is transmitted to the transmission path 3.

$$S'(i)=X(i) xor\ S(i)$$

In the present embodiment, the data decompressor 20 and the scrambling circuit 23 each hold the aforementioned common key and thus can obtain X(i) as with the data compressor 10 and the scrambling circuit 13. Then, upon X(i) and S'(i) being XORed according to the below expression, the compressed symbol S(i) can be obtained by unscrambling.

$$S(i)=X(i) xor\ S'(i)$$

Embodiment 8 enables enhancement in encrypting strength along with compression.

Embodiment 9

Where each of a data compressor 10 and a data decompressor 20 is formed by hardware, registration of an entry to the conversion table causes a bottleneck, which may delay (also referred to as "block") a flow of an entire pipeline. Therefore, in the present embodiment, during a period of time consumed for addition of an entry to a conversion table (processing cycle), even if there is no hit in the conversion table for a subsequent symbol, the symbol is output as it is without being added to the conversion table. Also, on the decompression side, also, when an entry is added to a conversion table, a subsequent symbol is output as it is during a corresponding period of time (processing cycle). Consequently, an output throughput can be enhanced. Also, such compression processing and decompression processing are referred to as non-block compression and non-block decoding. Non-block compression and decoding can be applied to each of the above-described embodiments.

For example, where one symbol has 8 bits and two pre-compression symbols are converted into one post-compression symbol, it is assumed that time consumed for addition of an entry to a conversion table corresponds to a processing cycle in which four symbols can be output in the case of no conversion. In this case, an example of processing a symbol string "AABBCCDDCCBBAABBAACC" will be described. Here, as illustrated in FIG. 27A, it is assumed that no entry is registered in an initial state of a conversion table.

Where non-block compression is performed, as illustrated in FIG. 27B, a first symbol pair "AA" is output as it is, and an entry with "AA" as a symbol string to be compressed is registered in the conversion table. In the example in FIG. 27B, the entry is registered, but addition of the entry consumes time corresponding to time consumed for processing four symbols, and thus, as illustrated in FIG. 27C, a subsequent symbol string "BBCC" is output as it is without being registered in the conversion table.

Subsequently, as illustrated in FIG. 27D, upon a symbol pair "DD" being input, there is no hit in the conversion table and the previous entry registration in the conversion table is completed, and thus, the symbol pair "DD" is output as it is and an entry with "DD" as a symbol string to be compressed is registered in the conversion table. Then, as illustrated in FIG. 27E, during a period of time consumed for registration of the entry in the conversion table, a subsequent symbol string "CCBB" is output without being registered in the conversion table.

Also, as illustrated in FIG. 27F, when a next symbol pair "AA" is input, there is a hit in an entry in the conversion table for the symbol pair "AA", and thus, a compressed symbol "0", which is in correspondence with the symbol pair "AA" in the relevant entry, is output. As described above, a throughput can be enhanced by preventing output from being blocked during a period of time consumed for registration of an entry in the conversion table.

Likewise, where non-block decoding is performed, as illustrated in FIG. 28A, as with the compression side, an initial state of a conversion table is brought into a state in which no entry is registered. Then, as illustrated in FIG. 28B, upon a first symbol pair "AA" being input, there is no hit in the conversion table, and thus the symbol string "AA" is output and an entry with "AA" as a decoded symbol string in the conversion table is added to the conversion table. Also, as illustrated in FIG. 28C, a subsequent symbol string "BBCC" is output as it is without being registered in the conversion table.

Subsequently, as illustrated in FIG. 28D, upon a symbol pair "DD" being input, there is no hit in the conversion table and the previous entry registration in the conversion table is completed, and thus, the symbol pair "DD" is output as it is and an entry with "DD" as a decoded symbol string is registered in the conversion table. Then, as illustrated in FIG. 28E, during a period of time consumed for registration of the entry in the conversion table, a subsequent symbol string "CCBB" is output without being registered in the conversion table.

Also, as illustrated in FIG. 28F, when a next symbol "0" is input, since the symbol "0" is registered as a compressed symbol in the relevant entry in the conversion table, the symbol "0" is converted into a decoded symbol "AA", which is in correspondence with the symbol "0" in the relevant entry, and the decoded symbol "AA" is output. As described above, on the decompression side, also, a throughput can be enhanced by preventing output from being blocked during a period of time consumed for registration of an entry to the conversion table.

[Other Alterations]

Also, if a type of symbols included in pre-compression stream data is known in advance, a symbol that cannot be included in the pre-compression stream data may be registered as a post-compression symbol in a conversion table. Consequently, whether or not a symbol is a compressed symbol can be determined with no reference to an overhead bit.

For example, if stream data is text data in which predetermined character codes are aligned in series, a pair of two characters is registered as pre-compression symbols, and a bit string not used in the character codes is assigned as a post-compression symbol. Also, for example, if stream data is genetic data (nucleic acid code sequence of "A", "G", "T" and "C"), a permutation of two characters taken from "A", "G", "T" and "C" as two pre-compression symbols in a lookup table, and a value other than "A", "G", "T" and "C" is assigned as one post-compression symbol.

Also, although in the above-described embodiments, two symbols are converted into one symbol, the number of pre-compression symbols in a combination is not limited to two. A data compressor functions if the data compressor is configured to replace a plurality of symbols with a number of symbols, the number is smaller than the number of the plurality of symbols. However, from the perspective of enhancement in rate of match between an entry in a conversion table and a symbol pair in stream data and the perspective of reduction in capacity of the conversion table, a mode in which two symbols are compressed into one symbol is preferable.

Also, in the above-described embodiments, if a symbol pair of a first symbol and a second symbol is not registered in a conversion table, next processing targets are a third symbol and a fourth symbol, and whether or not the symbol pair of the third symbol and the fourth symbol is registered in the conversion table is determined. Here, if the symbol pair of the first symbol and the second symbol is not registered in the conversion table, a next processing target may be a symbol pair of the second symbol and the third symbol. In this way, enhancement in compression rate can be expected.

The configurations of the embodiments and alternations described above can arbitrarily be combined.

DESCRIPTION OF THE REFERENCE NUMERALS AND SYMBOLS 1 transmission-side apparatus
10 data compressor
101 data stream control circuit
102 conversion table
103 to 106 latch
107 multiplexer
2 reception-side apparatus
20 data decompressor
201 data stream control circuit
202 conversion table
203 to 205 latch
3 transmission path

The invention claimed is:
1. A data compression/decompression system for processing a data string in units of symbols, each of the symbols being data having a fixed length, to compress and decompress the data string before and after transfer of the data string between apparatuses, wherein a transmission-side apparatus
searches a conversion table in which an entry indicating a correspondence between two or more pre-conversion symbols and one post-conversion symbol is registered, and if it is determined that two or more consecutive symbols in the data string are not registered as two or more pre-conversion symbols, registers an entry in which the two or more consecutive symbols are registered as two or more pre-conversion symbols, in the conversion table, and outputs the two or more consecutive symbols without conversion, and
if two or more consecutive symbols in the data string are registered as two or more pre-conversion symbols in an entry in the conversion table, converts the two or more consecutive symbols into one post-conversion symbol, the one post-conversion symbol being in correspondence with the two or more consecutive symbols in the entry, and outputs the one post-conversion symbol; and
wherein a reception-side apparatus
searches a conversion table in which an entry indicating a correspondence between a pre-decompression symbol and two or more post-decompression symbols is registered, and if it is determined that a symbol included in the data string is not registered as a pre-decompression symbol, registers an entry in which the symbol and a predetermined number of subsequent symbols included in the data string are registered as two or more post-decompression symbols, in the conversion table, and outputs the symbol and the predetermined number of subsequent symbols included in the data string without conversion, and
if a symbol included in the data string is registered as a pre-decompression symbol in an entry in the conversion table, converts the symbol included in the data string into two or more post-decompression symbols, the two or more post-decompression symbols being in correspondence with the symbol in the entry, and outputs the two or more post-decompression symbols; and
wherein each of the transmission-side apparatus and the reception-side apparatus, if the conversion table included in the relevant apparatus has no free space, deletes an entry registered at a positioned determined based on a predetermined rule and registers a new entry at the position.

2. A data compression method for causing a computer to process a data string in units of symbols, each of the symbols being data having a fixed length, to compress the data string, the method comprising:
searching a conversion table in which an entry indicating a correspondence between two or more pre-conversion symbols and one post-conversion symbol is registered, and if it is determined that two or more consecutive symbols in the data string are not registered as two or more pre-conversion symbols, registering an entry in which the two or more consecutive symbols are registered as two or more pre-conversion symbols, in the conversion table, and outputting the two or more consecutive symbols without conversion; and
if two or more consecutive symbols in the data string are registered as two or more pre-conversion symbols in an entry in the conversion table, converting the two or more consecutive symbols into one post-conversion symbol, the one post-conversion symbol being in correspondence with the two or more consecutive symbols in the entry, and outputting the one post-conversion symbol; and
if the conversion table has no free space, deleting an entry registered at a position determined based on a predetermined rule and registering a new entry at the position.

3. The data compression method according to claim 2, comprising:
counting, for each entry in conversion table, a value according to a number of times of appearance of two or more pre-conversion symbols indicated by the entry, in the data string; and
preferentially deleting an entry whose counted value according to the number of times of appearance is small, the entry being registered in the conversion table.

4. The data compression method according to claim 3, comprising:
when registering an entry in the conversion table, registering the entry at a position in free space in the conversion table, the position being determined based on a start position for storing an entry first and a rule for determining a position for storing a subsequent entry; and
when deleting an entry from the conversion table, determining a candidate position in an area of the conversion table, the candidate position being determined based on a start position for first determining whether or not to delete a registered entry and a rule for determining a position for subsequently determining whether or not to delete an entry, and if the value according to the number of times of appearance, the value being associated with the entry registered at the determined position, is equal to or below a predetermined threshold value, deleting the entry.

5. A data compression method comprising:
repeatedly performing the data compression method according to claim 2; and
with the compressed data output by the preceding data compression method as an input, performing the subsequent data compression method.

6. The data compression method according to claim 2, comprising encrypting at least a part of the symbol output without conversion or the symbol output after being subjected to conversion.

7. A data decompression method for causing a computer to process a data string received from an apparatus that is a communication partner, in units of symbols, each of the symbols being a data having a fixed length, to decompress the data string, the method comprising:
searching a conversion table in which an entry indicating a correspondence between a pre-decompression symbol and two or more post-decompression symbols is registered, and if it is determined that a symbol included in the data string is not registered as a pre-decompression symbol, registering an entry in which the symbol and a predetermined number of subsequent symbols included in the data string are registered as two or more post-decompression symbols, in the conversion table, and outputting the symbol and the predetermined number of subsequent symbols included in the data string without conversion; and
if a symbol included in the data string is registered as a pre-decompression symbol in an entry in the conversion table, converting the symbol included in the data string into two or more post-decompression symbols, the two or more post-decompression symbols being in correspondence with the symbol in the entry, and outputting the two or more post-decompression symbols; and if the conversion table has no free space, deleting an entry registered at a position determined based on a predetermined rule and registering a new entry at the position.

8. The data decompression method according to claim 7, comprising, if an instruction for resetting of a setting from the apparatus that is a communication partner, resetting an entry registered in advance in the conversion table, a start position for storing an entry in free space in the conversion table or a start position, in an area of the conversion table, for determining whether or not to delete an entry in the area.

* * * * *

UNITED STATES PATENT AND TRADEMARK OFFICE
CERTIFICATE OF CORRECTION

PATENT NO. : 9,948,319 B2
APPLICATION NO. : 15/560577
DATED : April 17, 2018
INVENTOR(S) : Shinichi Yamagiwa et al.

Page 1 of 1

It is certified that error appears in the above-identified patent and that said Letters Patent is hereby corrected as shown below:

In the Claims

At Column 29, Line 43, "positioned" should be -- position --

Signed and Sealed this
Fifth Day of March, 2019

Andrei Iancu
*Director of the United States Patent and Trademark Office*